(12) United States Patent
Shigetoshi et al.

(10) Patent No.: US 12,120,897 B2
(45) Date of Patent: Oct. 15, 2024

(54) SOLID-STATE IMAGING ELEMENT, ELECTRONIC DEVICE, AND MANUFACTURING METHOD OF SOLID-STATE IMAGING ELEMENT

(71) Applicants: SONY GROUP CORPORATION, Tokyo (JP); SONY SEMICONDUCTOR SOLUTIONS CORPORATION, Kanagawa (JP)

(72) Inventors: Takushi Shigetoshi, Kumamoto (JP); Hideaki Togashi, Kumamoto (JP); Junpei Yamamoto, Kanagawa (JP); Shinpei Fukuoka, Kanagawa (JP); Moe Takeo, Tokyo (JP); Sho Nishida, Tokyo (JP)

(73) Assignees: Sony Group Corporation, Tokyo (JP); Sony Semiconductor Solutions Corporation, Kanagawa (JP)

(*) Notice: Subject to any disclaimer, the term of this patent is extended or adjusted under 35 U.S.C. 154(b) by 471 days.

(21) Appl. No.: 17/424,582

(22) PCT Filed: Jan. 21, 2020

(86) PCT No.: PCT/JP2020/001960
§ 371 (c)(1),
(2) Date: Jul. 21, 2021

(87) PCT Pub. No.: WO2020/158515
PCT Pub. Date: Aug. 6, 2020

(65) Prior Publication Data
US 2022/0085110 A1 Mar. 17, 2022

(30) Foreign Application Priority Data
Jan. 28, 2019 (JP) .................................. 2019-011932

(51) Int. Cl.
*H10K 39/32* (2023.01)

(52) U.S. Cl.
CPC .................................... *H10K 39/32* (2023.02)

(58) Field of Classification Search
CPC .............. H01L 27/14643–14676; H10K 39/32
See application file for complete search history.

(56) References Cited

U.S. PATENT DOCUMENTS 9,036,064 B2 4/2015 Kasuga et al.
2015/0372036 A1 12/2015 Suh
(Continued)

FOREIGN PATENT DOCUMENTS

CN 108604592 A 9/2018
JP 2015038931 A 2/2015
(Continued)

OTHER PUBLICATIONS

International Search Report prepared by the Japan Patent Office on Mar. 31, 2020, for International Application No. PCT/JP2020/001960.

*Primary Examiner* — Daniel P Shook
(74) *Attorney, Agent, or Firm* — Sheridan Ross PC

(57) ABSTRACT

A solid-state imaging element according to the present disclosure includes one or more photoelectric conversion layers, a penetrating electrode, and a connection pad. The one or more photoelectric conversion layers are provided on one principal surface side serving as a light incidence plane of a semiconductor substrate. The penetrating electrode is provided in a pixel area, connected at one end to the photoelectric conversion layer to penetrate through front and back surfaces of the semiconductor substrate, and transfers an electric charge photoelectrically converted by the photoelectric conversion layer, to a different principal surface side of the semiconductor substrate. The connection pad is provided on a same layer as gates (Ga, Gr, G1, and g2) of transistors (AMP, RST, TG1, and TG2) provided on the (Continued)

different principal surface side of the semiconductor substrate, and to which a different end of the penetrating electrode is connected.

20 Claims, 22 Drawing Sheets

(56) References Cited

U.S. PATENT DOCUMENTS

| | | |
|---|---|---|
| 2016/0204156 A1 | 7/2016 | Togashi |
| 2017/0077431 A1 | 3/2017 | Mizuno et al. |
| 2018/0286922 A1 | 10/2018 | Togashi |
| 2018/0301487 A1 | 10/2018 | Lee |
| 2019/0057997 A1* | 2/2019 | Togashi .......... H01L 21/823456 |
| 2019/0088696 A1* | 3/2019 | Sato ....................... H04N 25/70 |

FOREIGN PATENT DOCUMENTS

| | | | |
|---|---|---|---|
| JP | 2016534557 A | 11/2016 | |
| JP | 2016225330 A | 12/2016 | |
| JP | 2017-054939 | 3/2017 | |
| JP | 2017-073436 | 4/2017 | |
| JP | 2018182327 A | 11/2018 | |
| KR | 20180112766 A | 10/2018 | |
| KR | 20180115391 A | 10/2018 | |
| TW | 201715716 A | 5/2017 | |
| WO | WO 2012/147302 | 11/2012 | |
| WO | WO2017138197 A1 * | 8/2017 | ............ H01L 27/46 |
| WO | WO2017/010311 A1 * | 4/2018 | ............ H04N 25/70 |
| WO | WO-2018180575 A1 | 10/2018 | |

* cited by examiner

SOLID-STATE IMAGING ELEMENT, ELECTRONIC DEVICE, AND MANUFACTURING METHOD OF SOLID-STATE IMAGING ELEMENT

CROSS REFERENCE TO RELATED APPLICATIONS

This application is a national stage application under 35 U.S.C. 371 and claims the benefit of PCT Application No. PCT/JP2020/001960 having an international filing date of 21 Jan. 2020, which designated the United States, which PCT application claimed the benefit of Japanese Patent Application No. 2019-011932 filed 28 Jan. 2019, the entire disclosures of each of which are incorporated herein by reference.

FIELD

The present disclosure relates to a solid-state imaging element, an electronic device, and a manufacturing method of a solid-state imaging element.

BACKGROUND

There is a back-illuminated solid-state imaging element including a photoelectric conversion layer provided on one principal surface (back surface) side serving as a light incidence plane of a semiconductor substrate, and a transistor that is provided on a different principal surface (front surface) side of the semiconductor substrate and processes an electric charge photoelectrically converted by the photoelectric conversion layer.

The back-illuminated solid-state imaging element includes a penetrating electrode penetrating through the front and back surfaces of the semiconductor substrate, for transferring the electric charge photoelectrically converted by the photoelectric conversion layer, from the back surface side to the front surface side of the semiconductor substrate (for example, refer to Patent Literature 1).

The penetrating electrode is connected at one end to the photoelectric conversion layer, and connected at a different end to a connection pad formed on a wiring layer buried in an interlayer insulating film stacked on the front surface side of the semiconductor substrate. The penetrating electrode is connected to the above-described transistor and the like via the connection pad.

CITATION LIST

Patent Literature

Patent Literature 1: Japanese Patent Application Laid-open No. 2017-73436

SUMMARY

Technical Problem

However, while miniaturization of the solid-state imaging element has been promoted, a thicker film tends to be demanded for achieving improvement in imaging property. As an aspect being a ratio of the depth of the penetrating electrode with respect to the width accordingly becomes higher, a difficulty level of a formation process of the penetrating electrode becomes higher, which has become a problem.

In view of the foregoing, the present disclosure proposes a solid-state imaging element, an electronic device, and a manufacturing method of a solid-state imaging element that can suppress a difficulty level of a formation process of a penetrating electrode to a low level.

Solution to Problem

According to the present disclosure, a solid-state imaging element is provided. The solid-state imaging element according to the present disclosure includes one or more photoelectric conversion layers, a penetrating electrode, and a connection pad. The one or more photoelectric conversion layers are provided on one principal surface side serving as a light incidence plane of a semiconductor substrate. The penetrating electrode is provided in a pixel area, connected at one end to the photoelectric conversion layer to penetrate through front and back surfaces of the semiconductor substrate, and transfers an electric charge photoelectrically converted by the photoelectric conversion layer, to a different principal surface side of the semiconductor substrate. The connection pad is provided on a same layer as gates of transistors provided on the different principal surface side of the semiconductor substrate, and to which a different end of the penetrating electrode is connected.

DESCRIPTION OF EMBODIMENTS

Figure 1:
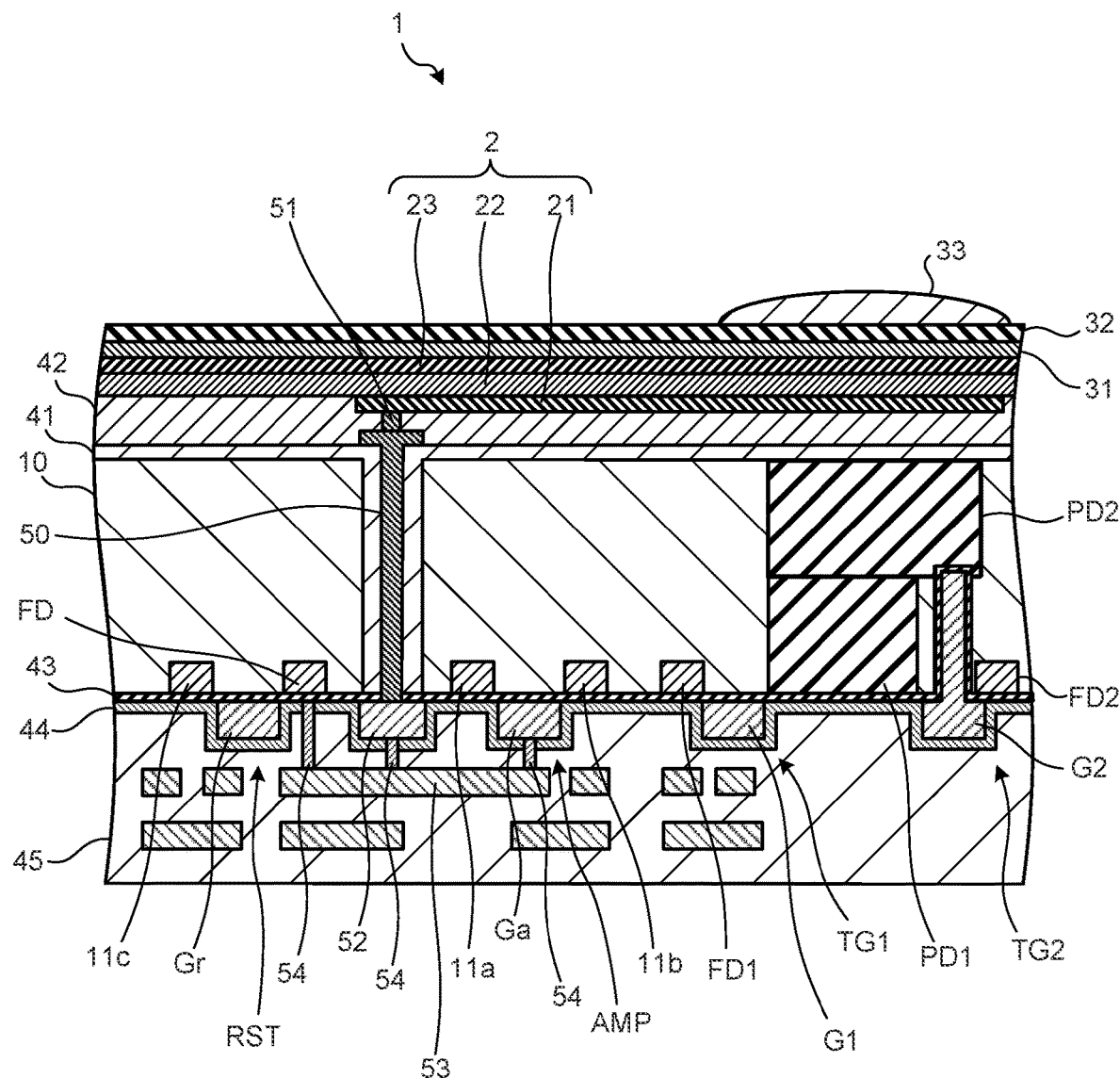
FIG. 1 is a cross-sectional explanatory diagram of a solid-state imaging element according to the present disclosure.

The description is now given of embodiments of the present disclosure in detail with reference to the drawings. Moreover, in embodiments described below, the same components are denoted by the same reference numerals, and a description thereof is omitted.

Furthermore, the present disclosure will be described in accordance with the following order of items.
1. Cross-Sectional Structure of Solid-State Image Sensor
2. Manufacturing Method of Solid-State Image Sensor
3. Example of Layout Configuration of Solid-State Image Sensor
4. Example of Circuit Configuration of Solid-State Image Sensor
5. Definition of Pixel Area
6. Modified Example 1 of Solid-State Image Sensor
7. Modified Example 2 of Solid-State Image Sensor
8. Modified Example 3 of Solid-State Image Sensor
9. Modified Example 4 of Solid-State Image Sensor
10. Configuration of Electronic Device Including Solid-State Image Sensor
11. Modified Example 1 and Modified Example 2 of Solid-State Imaging Apparatus
12. Example of Application to Endoscopic Operation System
13. Example of Application to Movable Body

1. Cross-Sectional Structure of Solid-State Image Sensor

FIG. 1 is a cross-sectional explanatory diagram of a solid-state imaging element according to the present disclosure. Note that FIG. 1 schematically illustrates a cross-section of a solid-state imaging element 1 corresponding to one pixel, among a plurality of solid-state imaging elements arranged in a matrix in a pixel area of a back-illuminated solid-state imaging apparatus that captures an image.

As illustrated in FIG. 1, the solid-state imaging element 1 includes, for example, a photoelectric conversion layer 2 provided on one principal surface (hereinafter, will be described as a back surface) side serving as a light incidence plane of a P-type semiconductor substrate 10, and a first photoelectric conversion element PD1 and a second photoelectric conversion element PD2 that are provided inside the semiconductor substrate 10.

The photoelectric conversion layer 2 includes a lower transparent electrode 21, an upper transparent electrode 23, and a photoelectric conversion film 22 arranged between the lower transparent electrode 21 and the upper transparent electrode 23. The photoelectric conversion film 22 has sensitivity to green light, for example, and converts incident green light into electric charges in an amount corresponding to received light intensity.

The photoelectric conversion layer 2 is stacked on the semiconductor substrate 10 via insulating films 41 and 42. Furthermore, a passivation film 31 and a planarization film 32 are stacked on the photoelectric conversion layer 2. Furthermore, an on-chip lens 33 is provided on the planarization film 32 at a position facing the first photoelectric conversion element PD1 and the second photoelectric conversion element PD2. The on-chip lens 33 condenses incident light to the first photoelectric conversion element PD1 and the second photoelectric conversion element PD2.

The first photoelectric conversion element PD1 is a region doped with an N-type impurity, and has sensitivity to red light, for example. The first photoelectric conversion element PD1 converts incident red light into electric charges in an amount corresponding to received light intensity. The second photoelectric conversion element PD2 is a region doped with an N-type impurity, and has sensitivity to blue light, for example. The second photoelectric conversion element PD2 converts incident blue light into electric charges in an amount corresponding to received light intensity.

Furthermore, the solid-state imaging element 1 includes a plurality of transistors such as an amplification transistor AMP, a reset transistor RST, and transfer transistors TG1 and TG2 on a different principal surface (hereinafter, will be described as a front surface) of the semiconductor substrate 10.

Note that an example of a layout configuration of these transistors and other transistors that are included in the solid-state imaging element 1 will be described later with reference to FIG. 8, and an example of a circuit configuration will be described later with reference to FIG. 9. The amplification transistor AMP includes a gate Ga, a source 11a, and a drain 11b. The amplification transistor AMP amplifies electric charges photoelectrically converted by the photoelectric conversion layer 2.

The reset transistor RST includes a gate Gr, a floating diffusion FD serving as a source, and a drain 11c. The reset transistor RST resets the floating diffusion FD that temporarily holds electric charges photoelectrically converted by the photoelectric conversion layer 2.

The transfer transistor TG1 includes a gate G1, the first photoelectric conversion element PD1 serving as a source, and a floating diffusion FD1 serving as a drain. The transfer transistor TG1 transfers electric charges photoelectrically converted by the first photoelectric conversion element PD1, from the first photoelectric conversion element PD1 to the floating diffusion FD1.

The transfer transistor TG2 includes a gate G2, the second photoelectric conversion element PD2 serving as a source, and a floating diffusion FD2 serving as a drain. The transfer transistor TG2 transfers electric charges photoelectrically converted by the second photoelectric conversion element PD2, from the second photoelectric conversion element PD2 to the floating diffusion FD2.

The floating diffusions FD, FD1, and FD2, the source 11a, and the drains 11b and 11c are regions doped with an N-type impurity and are provided on the inside of the front surface (bottom surface in FIG. 1) side of the semiconductor substrate 10.

The gates Ga, Gr, and G1 are provided on the top layer inside an interlayer insulating film 45 stacked on the front surface (bottom surface in FIG. 1) side of the semiconductor substrate 10. The gate G2 extends from the top layer inside the interlayer insulating film 45 up to the second photoelectric conversion element PD2 inside the semiconductor substrate 10. A gate insulating film 43 is provided between these gates Ga, Gr, G1, and G2, and the semiconductor substrate 10.

Furthermore, a Contact Etch Stop Layer (CESL) film 44 is provided between the gates Ga, Gr, G1, and G2, and the interlayer insulating film 45. Moreover, a metal wiring layer 53 is provided on the lower layer side of the gates Ga, Gr, and G1 inside the interlayer insulating film 45.

In this manner, in the solid-state imaging element 1, the amplification transistor AMP, the reset transistor RST, and the like that process electric charges photoelectrically converted by the photoelectric conversion layer 2 provided on the back surface (top surface in FIG. 1) side of the semiconductor substrate 10 are provided on the front surface (bottom surface in FIG. 1) side of the semiconductor substrate 10.

Thus, the solid-state imaging element 1 includes, in a pixel area, a penetrating electrode 50 that is connected at one end to the photoelectric conversion layer 2 to penetrate through the front and back surfaces of the semiconductor substrate 10, and transfers electric charges photoelectrically converted by the photoelectric conversion layer 2, to the front surface side of the semiconductor substrate 10. Note that one end (upper end in FIG. 1) of the penetrating electrode 50 is connected to the lower transparent electrode 21 of the photoelectric conversion layer 2 via a contact via 51.

Here, a general penetrating electrode is connected at a different end to a connection pad formed on a wiring layer buried inside an interlayer insulating film stacked on the front surface side of a semiconductor substrate, and is connected to a gate of an amplification transistor and a floating diffusion via the connection pad.

Such a general penetrating electrode is formed by forming a through-hole reaching the connection pad formed on the wiring layer inside the interlayer insulating film stacked on the front surface side from the back surface of the semiconductor substrate, and providing a conductive member inside the through-hole.

However, while miniaturization of the solid-state imaging element has been promoted in recent years, a thicker film tends to be demanded for achieving improvement in imaging property. As an aspect being a ratio of the depth of the penetrating electrode with respect to the width accordingly becomes higher, a difficulty level of a formation process of the penetrating electrode becomes higher, which has become a problem.

Specifically, in a case where a penetrating electrode is arranged in a pixel area of a back-illuminated solid-state imaging apparatus, if a percentage of an area occupied by the penetrating electrode becomes larger, an imaging property of the solid-state imaging element deteriorates. Thus, the penetrating electrode and the connection pad on the front surface side of the semiconductor substrate that connects with the penetrating electrode need to be miniaturized with respect to a pixel size.

However, in recent years, while a pixel size of a back-illuminated solid-state imaging element is reduced up to several micrometers, the film thickness of a semiconductor substrate tends to be maintained or thickened for improving the characteristics of a solid-state imaging element. If a penetrating electrode is sufficiently miniaturized to be smaller than a pixel size, a super-high-aspect structure is obtained.

Thus, a difficulty level of a process of forming, by dry etching, a through-hole having a super-high-aspect structure of penetrating through the front and back surfaces of a semiconductor substrate, and further reaching a connection pad buried in an interlayer insulating film has been getting higher. In such a background, the above-described general penetrating electrode has the following two issues.

The first issue lies in that a processing amount and a processing aspect increase because an interlayer insulating film from a semiconductor substrate up to a wiring layer also needs to be removed in a process of processing the interlayer insulating film by dry etching and forming a through-hole reaching a connection pad.

Because the difficulty level of dry etching accordingly increases, the occurrence risk of an open failure of the penetrating electrode due to a processing failure increases. Furthermore, because a rate of dry etching declines as an aspect becomes higher, an increase in processing amount that corresponds to the interlayer insulating film exerts a large influence on production cost.

The second issue lies in that metal material of a wiring layer is used for a connection pad. In a case where metal material is used for a connection pad, when an interlayer insulating film is processed by dry etching and a through-hole reaching the connection pad is formed, there is concern that metal of the connection pad scatters and noise characteristics of a solid-state imaging element deteriorate.

Furthermore, when dry etching of an interlayer insulating film is performed at a super-high aspect, because the dry etching is performed under the condition of high ion energy, it is difficult to avoid the scattering of metal material that is caused by sputtering. Furthermore, because cleaning in a subsequent process also needs to be performed without etching an insulating film on the penetrating electrode side surface at a high aspect, it is difficult to sufficiently remove scattered metal.

Furthermore, because fluorocarbon gas or hydrofluorocarbon gas is generally used in the dry etching of an interlayer insulating film, there is concern that an altered layer is formed in metal material, or a reaction product containing metal is generated, and a resistance value of a penetrating electrode becomes unstable.

In view of the foregoing, as illustrated in FIG. 1, a connection pad 52 to which the different end (lower end in FIG. 1) of the penetrating electrode 50 according to the present disclosure is connected is provided on the same layer as the gates of the transistors provided on the front surface side of the semiconductor substrate 10.

Specifically, the connection pad 52 is provided on the same layer as the gate Ga of the amplification transistor AMP, the gate Gr of the reset transistor RST, the gate G1 of the transfer transistor TG1, and the gate G2 of the transfer transistor TG2. In addition, the connection pad 52 is connected to the gate Ga of the amplification transistor AMP and the floating diffusion FD via a contact via 54 and the wiring layer 53.

As described above, the gates Ga, Gr, G1, and G2 are provided on the top layer of the interlayer insulating film 45. Thus, in the present disclosure, the connection pad 52 becomes closer to the semiconductor substrate 10, and it becomes possible to form a through-hole for providing the penetrating electrode 50, only by forming a through-hole penetrating through the front and back surfaces of the semiconductor substrate 10, without processing the interlayer insulating film 45 by dry etching.

Accordingly, in the solid-state imaging element 1, because a processing amount and a processing aspect of dry etching for forming a through-hole for providing the penetrating electrode 50 become smaller, a difficulty level of a formation process of the penetrating electrode 50 can be suppressed to a low level.

Furthermore, in the solid-state imaging element 1, because an aspect of the penetrating electrode 50 becomes lower, it is possible to increase a yield ratio of products by reducing the occurrence risk of an open failure of the penetrating electrode 50. Moreover, in the solid-state imaging element 1, because a processing amount of dry etching for forming a through-hole for providing the penetrating electrode 50 becomes smaller, it is also possible to enhance productivity by increasing throughput of a manufacturing process.

Furthermore, because the connection pad 52 according to the present disclosure is provided on the same layer as the gates Ga, Gr, G1, and G2, for example, semiconductor material such as amorphous silicon or polycrystal silicon that is the same as the material of the gate Ga or the like can be selected instead of the metal material of the wiring layer 53 or the like.

Thus, in the solid-state imaging element 1, it is possible to prevent metal from scattering in a process of forming a through-hole reaching the connection pad 52 from the back surface of the semiconductor substrate 10, for providing the penetrating electrode 50.

Accordingly, according to the solid-state imaging element 1, a deterioration in noise characteristics that is caused by metal scattering during a manufacturing process can be avoided, and the generation of an affected layer and a reaction product can be reduced as compared with metal material. Thus, a resistance value of the penetrating electrode 50 becomes stable.

Note that, in FIG. 1, the connection pad 52 is connected to the gate Ga and the floating diffusion FD via the wiring layer 53, but the connection pad 52 may be connected with at least either one of the gate Ga or the floating diffusion FD.

In a case where the connection pad 52 is connected with the gate Ga, the gate Ga and the floating diffusion FD are connected via a different wiring layer. Furthermore, in a case where the connection pad 52 is connected with the floating diffusion FD, the floating diffusion FD and the gate Ga are connected via a different wiring layer.

Also with this configuration, the arrangement of the penetrating electrode 50 and the connection pad 52 has a configuration similar to that in the solid-state imaging element 1 illustrated in FIG. 1. Thus, it is possible to suppress a difficulty level of a formation process of the penetrating electrode 50 to a low level.

2. Manufacturing Method of Solid-State Image Sensor

Next, a manufacturing method of the solid-state imaging element 1 according to the present disclosure will be described with reference to FIGS. 2 to 6. FIGS. 2 to 6 are explanatory diagrams illustrating a manufacturing process of the solid-state imaging element 1 according to the present disclosure.

Figure 2:
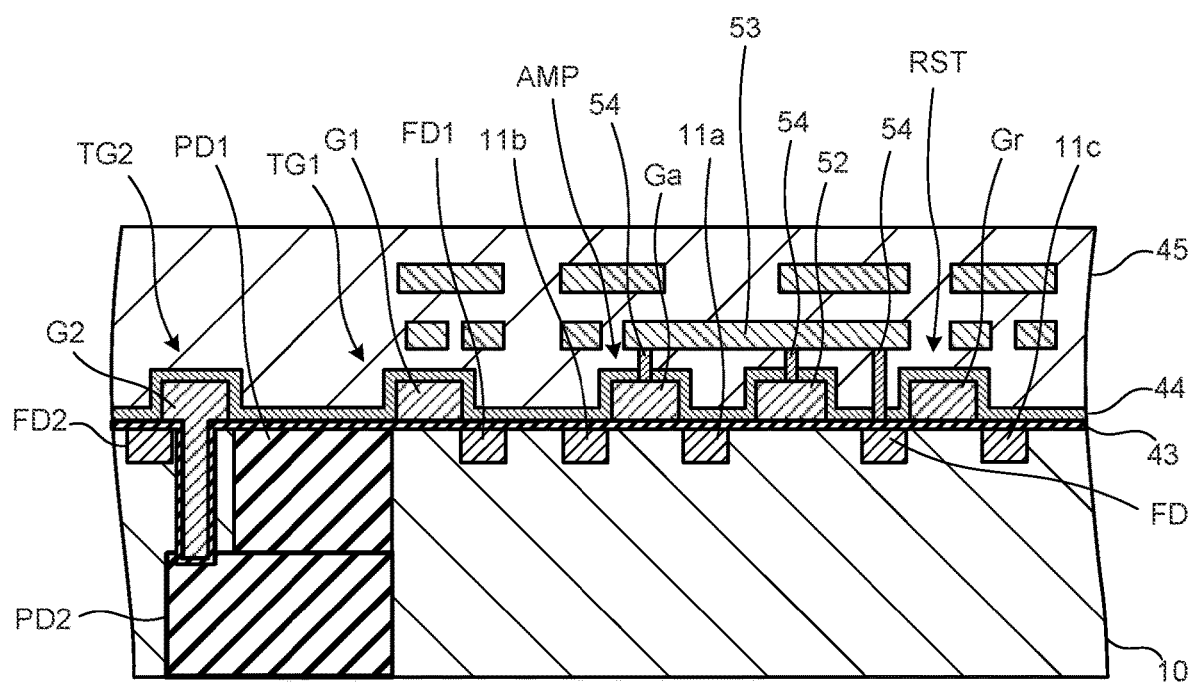
FIG. 2 is an explanatory diagram illustrating a manufacturing process of the solid-state imaging element according to the present disclosure.

In a case where the solid-state imaging element 1 is manufactured, as illustrated in FIG. 2, first of all, the first photoelectric conversion element PD1 and the second photoelectric conversion element PD2 are formed by ion-implanting an N-type impurity such as phosphorus, for example, into a predetermined region inside the semiconductor substrate 10 such as a silicon on insulator (SOI) substrate doped with a P-type impurity such as boron, for example.

After that, an opening is formed at a formation position of the gate G2 of the transfer transistor TG2 in the semiconductor substrate 10, and then the gate insulating film 43 is formed on the front surface of the semiconductor substrate 10. Subsequently, the gates Ga, Gr, G1, and G2 are formed at predetermined positions on the gate insulating film 43.

At this time, on the same layer as the layer on which the gates Ga, Gr, G1, and G2 are formed, the connection pad 52 is formed at a position facing a position at which the penetrating electrode 50 is to be formed afterward. The connection pad 52 is formed in such a manner that an area in a planar view becomes equal to or smaller than 1/10 of a pixel size, and optimally becomes equal to or smaller than 1/30 of a pixel size.

Furthermore, as the material of the gates Ga, Gr, G1, and G2, and the connection pad 52, for example, a semiconductor such as amorphous silicon or polycrystal silicon that is doped with an impurity at high concentration can be employed in addition to metal material similar to the penetrating electrode 50.

In a case where the same material as the gates Ga, Gr, G1, and G2 is employed as the material of the connection pad 52, the gates Ga, Gr, G1, and G2, and the connection pad 52 can be simultaneously formed. Thus, the connection pad 52 can be formed without increasing the number of manufacturing processes.

Furthermore, in a case where a semiconductor doped with an impurity is employed as the material of the connection pad 52, it is possible to suppress the generation of the above-described problems caused by metal scattering, in a process of processing a through-hole for providing the penetrating electrode 50, by plasma etching.

Specifically, in a case where a semiconductor doped with an impurity is employed as the material of the connection pad 52, it is possible to avoid a deterioration in noise characteristics that is caused by metal scattering, and the instability of a resistance value of the penetrating electrode 50 that is caused by a metal altered layer and a reaction product containing metal.

After that, by ion-implanting an N-type impurity into a predetermined position on the surface layer in the semiconductor substrate 10, the floating diffusions FD, FD1, and FD2, the source 11a, and the drains 11b and 11c are formed. In this manner, the amplification transistor AMP, the reset transistor RST, and the transfer transistors TG1 and TG2 are formed on the front surface side of the semiconductor substrate 10.

Subsequently, the CESL film 44 is formed on the gates Ga, Gr, G1, and G2, the connection pad 52, and the gate insulating film 43, and then the interlayer insulating film 45, the wiring layer 53, and the contact via 54 are formed on the CESL film 44. In this process, the connection pad 52, and the gate Ga and the floating diffusion FD are connected via the contact via 54 and the wiring layer 53.

Figure 3:
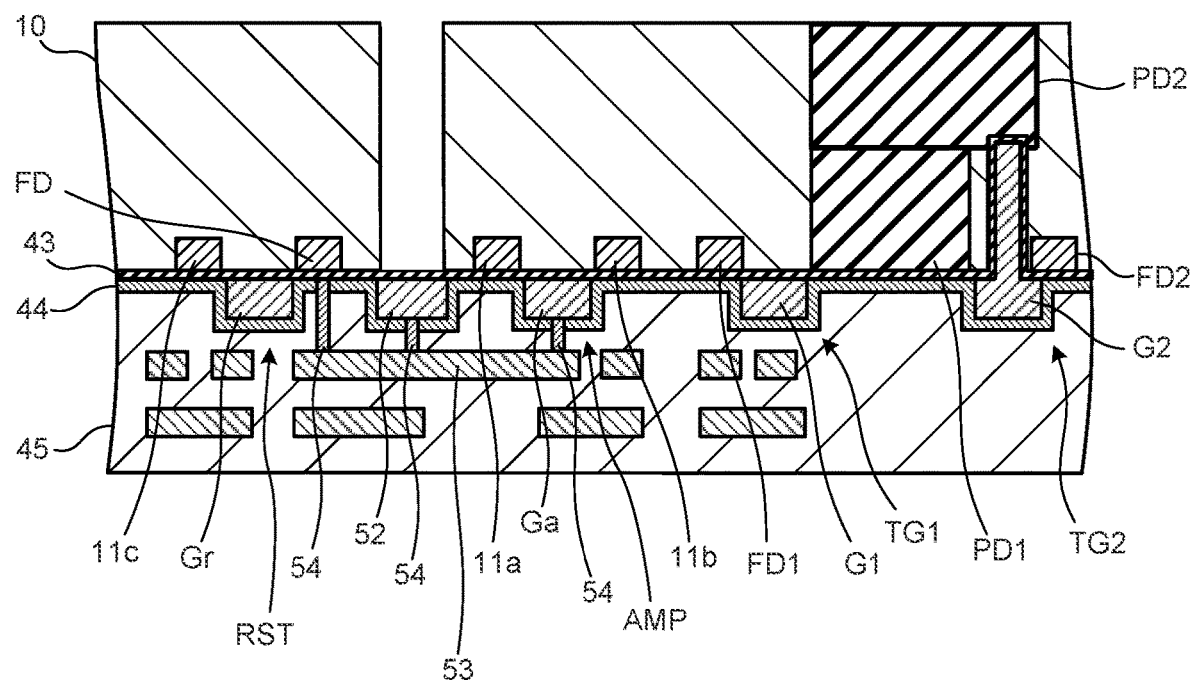
FIG. 3 is an explanatory diagram illustrating a manufacturing process of the solid-state imaging element according to the present disclosure.

After that, as illustrated in FIG. 3, the semiconductor substrate 10 is turned upside down, and a through-hole reaching the top surface of the gate insulating film 43 from the back surface (top surface in FIG. 3) of the semiconductor substrate 10 is formed by dry etching at a position at which the penetrating electrode 50 is to be arranged. In a case where the thickness of the semiconductor substrate 10 is 2 µm to 10 µm, the through-hole is formed in such a manner that a diameter in a planar view becomes 150 nm to 600 nm.

Figure 4:
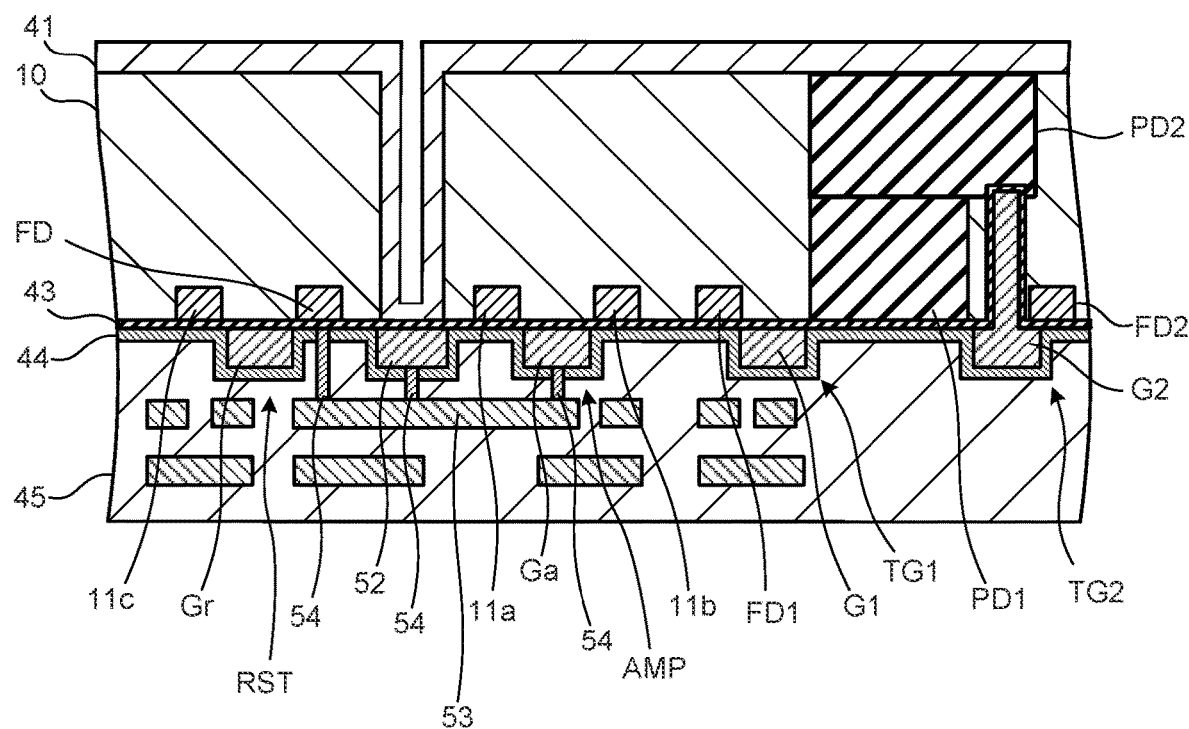
FIG. 4 is an explanatory diagram illustrating a manufacturing process of the solid-state imaging element according to the present disclosure.

Subsequently, as illustrated in FIG. 4, the insulating film 41 is deposited over the entire back surface of the semiconductor substrate 10 including the through-hole, by an atomic layer deposition (ALD) method. As the material of the insulating film 41, for example, a silicon oxide film, tetra-ethoxysilane (TEOS), a silicon nitride film, or a silicon oxynitride film can be employed. Furthermore, as the material of the insulating film 41, dielectric material having insulation properties, such as a porous SiOC film, a porous Hydrogen Silsesquioxane (HSQ) film, or a porous Methyl Silsesquioxane (MSQ) film, a so-called Low-k film, can be employed.

At this time, an antireflection film may be stacked between the semiconductor substrate 10 and the insulating film 41 by ALD or Physical Vapor Deposition (PVD). The antireflection film has negative fixed electric charges, and can also play a role of prevention of dark current from the semiconductor substrate 10.

As the material of the antireflection film, hafnium oxide ($HfO_2$), an aluminum oxide ($Al_2O_3$) film, a zirconium oxide ($ZrO_2$) film, a tantalum oxide ($Ta_2O_5$) film, a titanium oxide ($TiO_2$) film, or a lanthanum oxide ($La_2O_3$) film can be employed.

As the material of the antireflection film, a praseodymium oxide ($Pr_2O_3$) film, a cerium oxide ($CeO_2$) film, a neodymium oxide ($Nd_2O_3$) film, a promethium oxide ($Pm_2O_3$) film, or a samarium oxide ($Sm_2O_3$) film can also be employed.

Furthermore, as the material of the antireflection film, an europium oxide ($Eu_2O_3$) film, a gadolinium oxide ($Gd_2O_3$) film, a terbium oxide ($Tb_2O_3$) film, a dysprosium oxide ($Dy_2O_3$) film, or a holmium oxide ($Ho_2O_3$) film can also be employed.

Furthermore, as the material of the antireflection film, a thulium oxide ($Tm_2O_3$) film, an ytterbium oxide ($Yb_2O_3$) film, a lutetium oxide ($Lu_2O_3$) film, an yttrium oxide ($Y_2O_3$) film, or a hafnium nitride film can also be employed.

Furthermore, as the material of the antireflection film, an aluminum nitride film, a hafnium oxynitride film, or an aluminum oxynitride film can also be employed. Note that these antireflection films can be formed by a chemical vapor deposition (CVD) method, the PVD method, or the ALD method.

Figure 5:
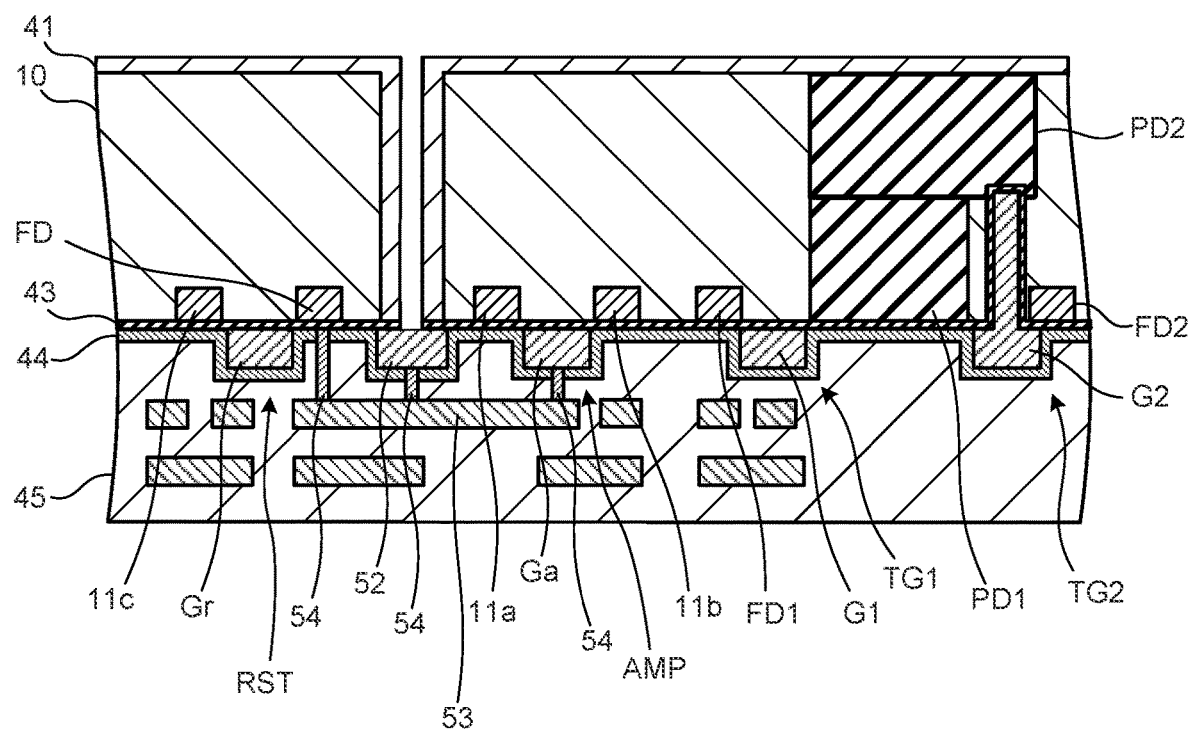
FIG. 5 is an explanatory diagram illustrating a manufacturing process of the solid-state imaging element according to the present disclosure.

Subsequently, as illustrated in FIG. 5, the insulating film 41 in a through-hole bottom portion is removed by dry etching until reaching the connection pad 52 on the front surface side. At this time, the inner circumferential surface of the through-hole is covered with the insulating film 41 in such a manner that an inner diameter in a planar view becomes 50 nm to 400 nm.

At this time, if the thickness of the semiconductor substrate 10 is 4 µm and the diameter of the through-hole is 200 nm, an aspect of the through-hole becomes about 4 µm/200 nm=20, and a difficulty level of processing by dry etching becomes not so high.

Figure 6:
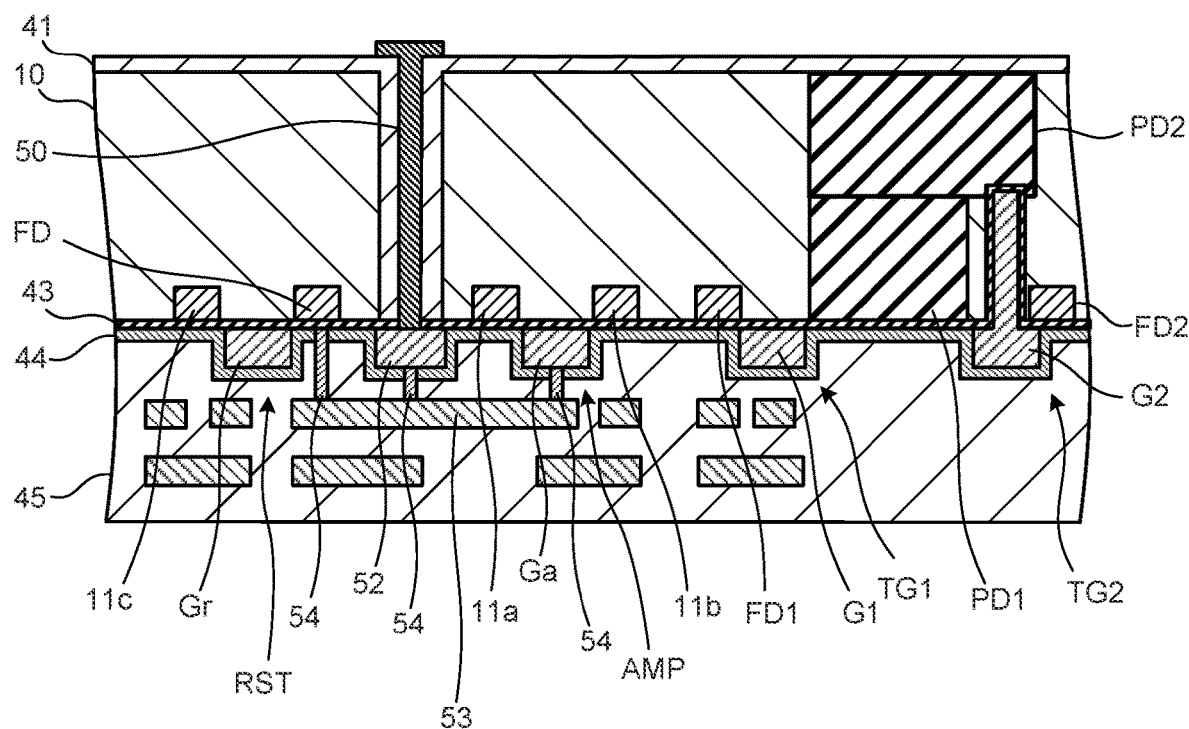
FIG. 6 is an explanatory diagram illustrating a manufacturing process of the solid-state imaging element according to the present disclosure.

After that, as illustrated in FIG. 6, the penetrating electrode 50 is formed by forming a conductive film over the entire back surface of the semiconductor substrate 10 including the through-hole, and then removing the conductive film by dry etching excluding a region that is to become the penetrating electrode 50. As the material of the penetrating electrode 50, metal material such as aluminum, tungsten, titanium, cobalt, hafnium, tantalum, copper, or ruthenium can be employed.

Figure 7:
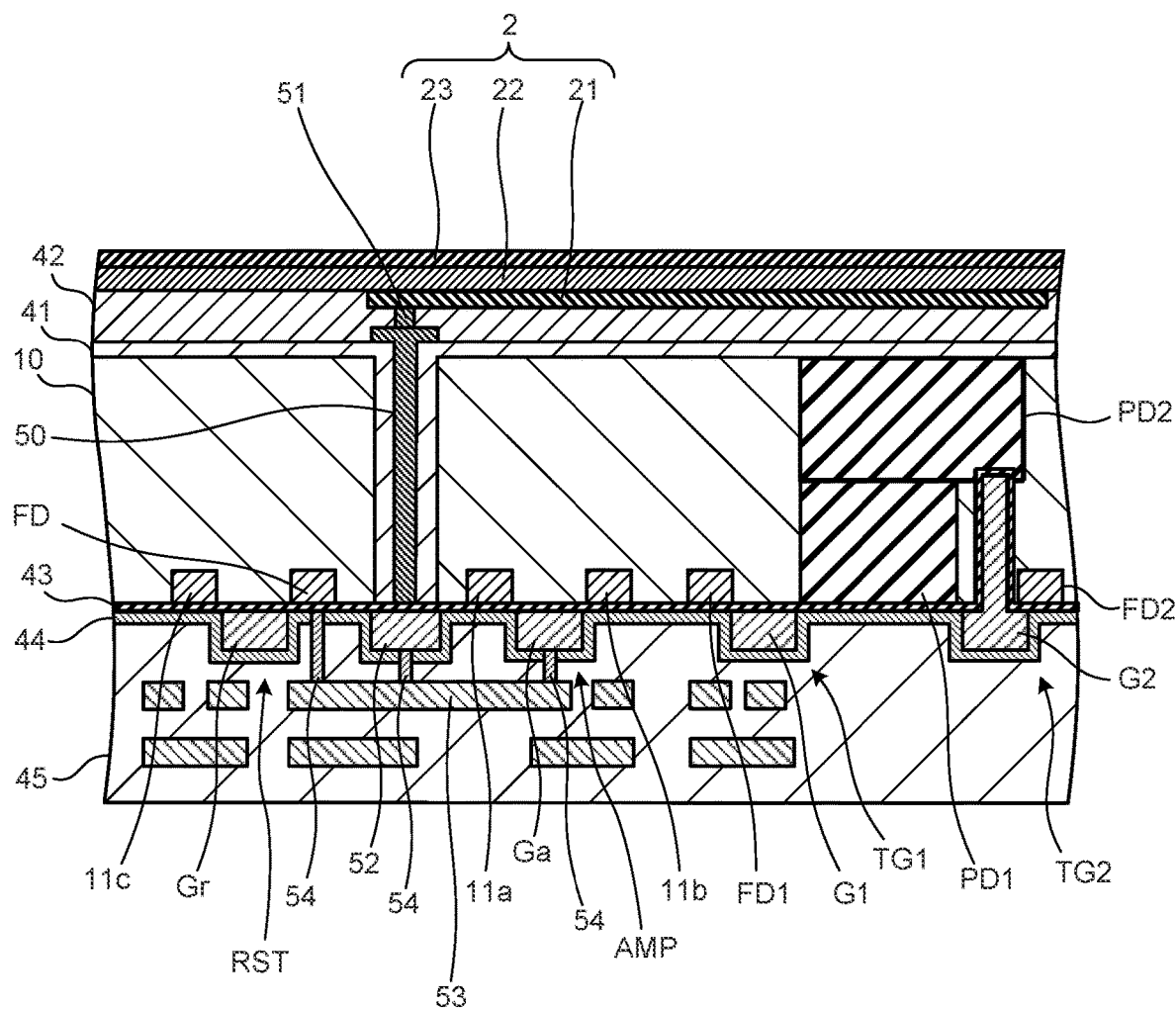
FIG. 7 is an explanatory diagram illustrating a manufacturing process of the solid-state imaging element according to the present disclosure.

After that, as illustrated in FIG. 7, the insulating film 42 covering the penetrating electrode 50 and the insulating film 41 is formed, and the top surface of the insulating film 41 is planarized by chemical mechanical polishing (CMP), for example.

Subsequently, the contact via 51 is formed by forming a contact hole reaching the penetrating electrode 50, at a predetermined position of the insulating film 42 by patterning the insulating film 42, and filling the contact hole with conductive material. After that, the photoelectric conversion layer 2 is formed by sequentially stacking the lower transparent electrode 21, the photoelectric conversion film 22, and the upper transparent electrode 23 on the front surface side of the semiconductor substrate 10.

As the material of the photoelectric conversion film 22, organic photoelectric conversion material such as rhodamine series dye, merocyanine series dye, or quinacridone, superfine particle material such as Si, InN, GaN, CdSe, or ZnTe, or the like can be employed. Lastly, the solid-state imaging element 1 illustrated in FIG. 1 is completed by sequentially stacking the passivation film 31, the planarization film 32, and the on-chip lens 33 on the upper transparent electrode 23.

3. Example of Layout Configuration of Solid-State Image Sensor

Next, an example of a layout configuration of the solid-state imaging element 1 will be described with reference to FIG. 8. FIG. 8 is an explanatory diagram illustrating an example of a layout configuration of the solid-state imaging element 1 according to the present disclosure. Note that an upper part of FIG. 8 illustrates an example of the layout of the second photoelectric conversion element PD2 and the penetrating electrode 50 that are included in the solid-state imaging element 1, and a lower part illustrates the lower transparent electrode 21.

Figure 8:
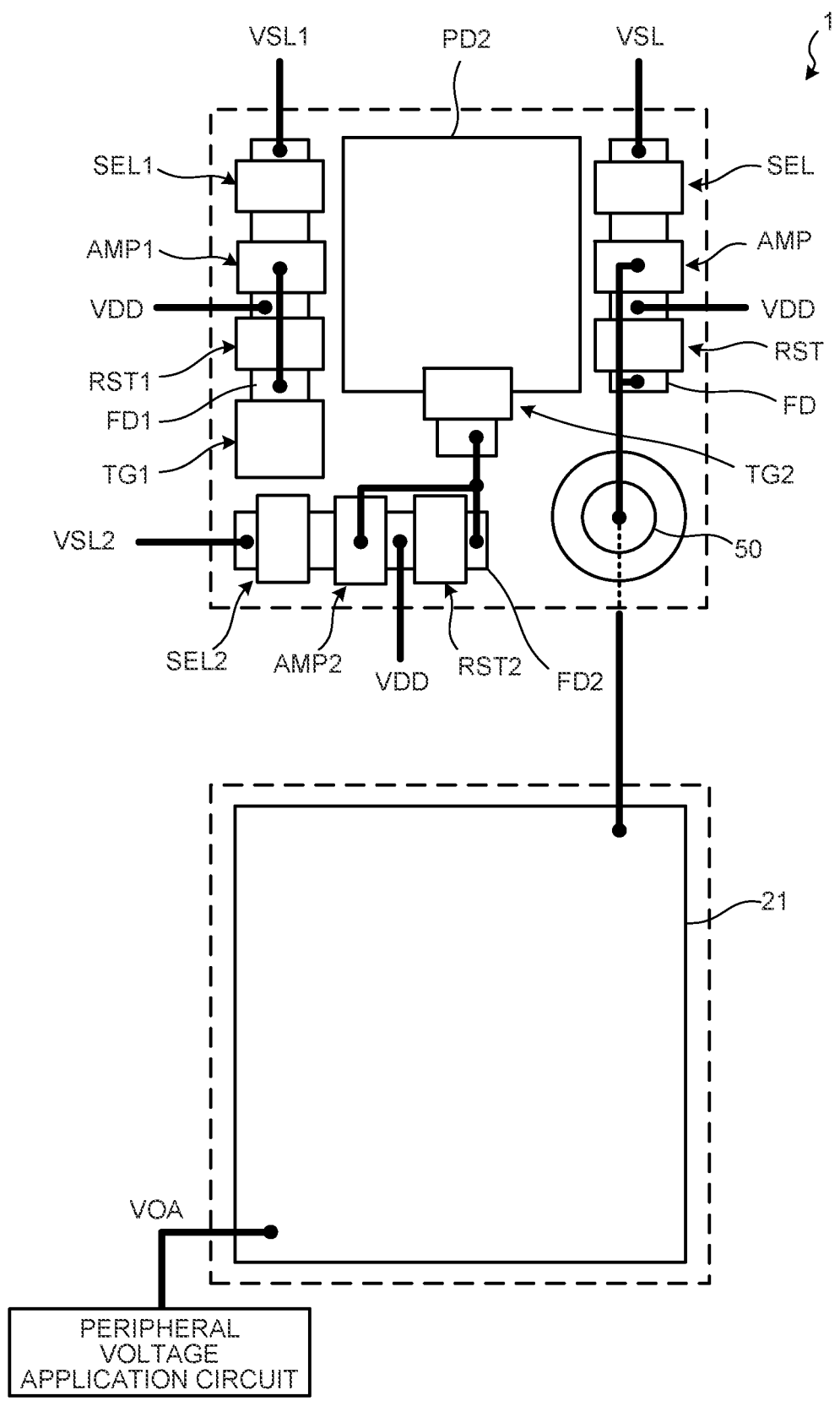
FIG. 8 is an explanatory diagram illustrating an example of a layout configuration of the solid-state imaging element according to the present disclosure.

As illustrated in the upper part of FIG. 8, in the solid-state imaging element 1, a selection transistor SEL, the amplification transistor AMP, and the reset transistor RST for the photoelectric conversion layer 2 are arranged along one side (right end in FIG. 8) of two facing sides of a pixel having a rectangular shape in a planar view.

The selection transistor SEL is turned on in a case where electric charges photoelectrically converted by the photoelectric conversion layer 2 are to be read out, and outputs a voltage corresponding to the photoelectrically converted electric charges, to a signal readout line VSL. Furthermore, a gate of the amplification transistor AMP and the floating diffusion FD are connected with the lower transparent electrode 21 via the penetrating electrode 50. Note that a power supply voltage VDD is applied to a drain of the amplification transistor AMP. The lower transparent electrode 21 is connected to a peripheral voltage application circuit, and a predetermined voltage VOA is applied thereto.

In addition, in the solid-state imaging element 1, a selection transistor SEL1, the amplification transistor AMP1, and the reset transistor RST1 for the first photoelectric conversion element PD1 are arranged along another side (left end in FIG. 8) of two facing sides of a pixel having a rectangular shape in a planar view.

The selection transistor SEL1 is turned on in a case where electric charges photoelectrically converted by the first photoelectric conversion element PD1 are to be read out, and outputs a voltage corresponding to the photoelectrically converted electric charges, to a signal readout line VSL1. Furthermore, a gate of the amplification transistor AMP1 is connected with the floating diffusion FD1. A power supply voltage VDD is applied to a drain of the amplification transistor AMP1.

Furthermore, in the solid-state imaging element 1, the selection transistor SEL2, the amplification transistor AMP2, and the reset transistor RST2 for the second photoelectric conversion element PD2 are arranged along one side (lower end in FIG. 8) on which the transistors for the photoelectric conversion layer 2 and the transistors for the first photoelectric conversion element PD1 are not provided, among four sides of the pixel having a rectangular shape in a planar view.

The selection transistor SEL2 is turned on in a case where electric charges photoelectrically converted by the second photoelectric conversion element PD2 are to be read out, and outputs a voltage corresponding to the photoelectrically converted electric charges, to a signal readout line VSL2. Furthermore, a gate of the amplification transistor AMP2 is connected with the floating diffusion FD2 and a drain of the transfer transistor TG2. A power supply voltage VDD is applied to a drain of the amplification transistor AMP2.

Furthermore, in the solid-state imaging element 1, the second photoelectric conversion element PD2 is arranged in a region surrounded by the transistors for the photoelectric conversion layer 2, the transistors for the first photoelectric conversion element PD1, and the transistors for the second photoelectric conversion element PD2, inside the pixel having a rectangular shape in a planar view. Note that a layout configuration of the solid-state imaging element 1 is not limited to the layout configuration illustrated in FIG. 8.

4. Example of Circuit Configuration of Solid-State Image Sensor

Next, an example of a circuit configuration of the solid-state imaging element 1 will be described with reference to FIG. 9. FIG. 9 is an explanatory diagram illustrating an example of a circuit configuration of the solid-state imaging element 1 according to the present disclosure. As illustrated in FIG. 9, the transfer transistor TG1 for the first photoelectric conversion element PD1 is connected to a transfer gate line Tg1 at a gate, connected to the first photoelectric conversion element PD1 at a source, and connected to the floating diffusion FD1 at a drain.

Furthermore, the reset transistor RST1 for the first photoelectric conversion element PD1 is connected to a reset gate line Rst1 at a gate and connected to the floating diffusion FD1 at a source, and the power supply voltage VDD is applied to a drain.

Furthermore, the amplification transistor AMP1 for the first photoelectric conversion element PD1 is connected to the floating diffusion FD1 at a gate and connected to a drain of the selection transistor SEL1 at a source, and the power supply voltage VDD is applied to a drain.

Furthermore, the selection transistor SEL1 for the first photoelectric conversion element PD1 is connected to a selection gate line Sel1 at a gate, connected to the signal readout line VSL1 at a source, and connected to a source of the amplification transistor AMP1 at a drain.

Furthermore, the transfer transistor TG2 for the second photoelectric conversion element PD2 is connected to a transfer gate line Tg2 at a gate, connected to the second photoelectric conversion element PD2 at a source, and connected to the floating diffusion FD2 at a drain.

Furthermore, the reset transistor RST2 for the second photoelectric conversion element PD2 is connected to a reset gate line Rst2 at a gate and connected to the floating diffusion FD2 at a source, and the power supply voltage VDD is applied to a drain.

Furthermore, the amplification transistor AMP2 for the second photoelectric conversion element PD2 is connected to the floating diffusion FD2 at a gate and connected to a drain of the selection transistor SEL2 at a source, and the power supply voltage VDD is applied to a drain.

Furthermore, the selection transistor SEL2 for the second photoelectric conversion element PD2 is connected to a selection gate line Sel2 at a gate, connected to the signal readout line VSL2 at a source, and connected to a source of the amplification transistor AMP2 at a drain.

Furthermore, the reset transistor RST for the photoelectric conversion layer 2 is connected to a reset gate line Rst3 and connected to the floating diffusion FD at a source, and the power supply voltage VDD is applied to a drain. The floating diffusion FD is connected to the lower transparent electrode 21 of the photoelectric conversion layer 2 via the penetrating electrode 50.

Furthermore, in the photoelectric conversion layer 2, the predetermined voltage VOA is applied to the lower transparent electrode 21 and a predetermined voltage VOU is applied to the upper transparent electrode 23. An electric field is thus formed in the photoelectric conversion film 22 based on a difference voltage between the voltage VOU and the voltage VOA.

Furthermore, the amplification transistor AMP for the photoelectric conversion layer 2 is connected to the floating diffusion FD at a gate and connected to a drain of the selection transistor SEL at a source, and the power supply voltage VDD is applied to a drain.

Furthermore, the selection transistor SEL for the photoelectric conversion layer 2 is connected to a selection gate line Sel3 at a gate, connected to the signal readout line VSL3 at a source, and connected to a source of the amplification transistor AMP at a drain. Note that a circuit configuration of the solid-state imaging element 1 is not limited to the circuit configuration illustrated in FIG. 9.

Note that the above-described embodiment is an example, and the structure of the solid-state imaging element according to the present disclosure is not limited to the structure illustrated in FIG. 1. Next, Modified Examples 1 to 4 of the solid-state imaging element according to the present disclosure will be described.

5. Definition of Pixel Area

As described above, the penetrating electrode 50 of the solid-state imaging element 1 is provided in a pixel area (pixel region) in a solid-state imaging apparatus. Here, the definition of a pixel area of the solid-state imaging apparatus according to the present disclosure will be described with reference to FIGS. 10 and 11.

Figure 10:
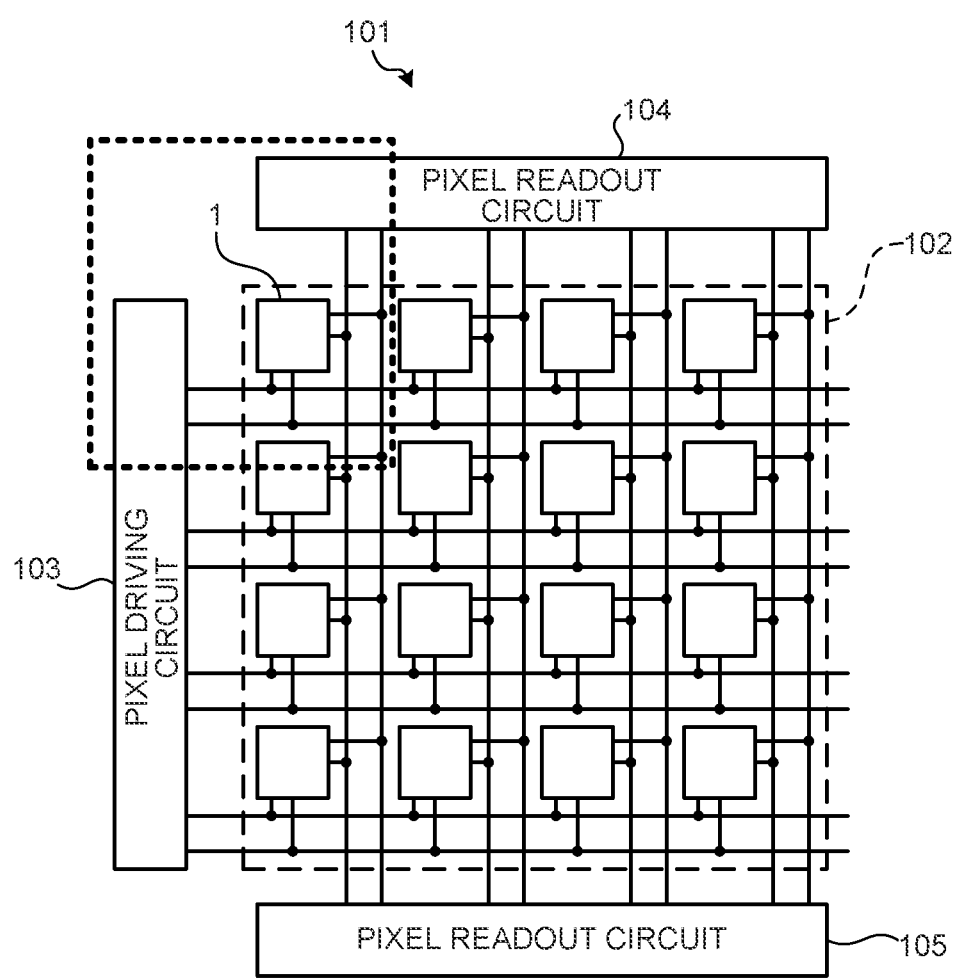
FIG. 10 is a planar explanatory diagram of a solid-state imaging apparatus according to the present disclosure.
Figure 11:
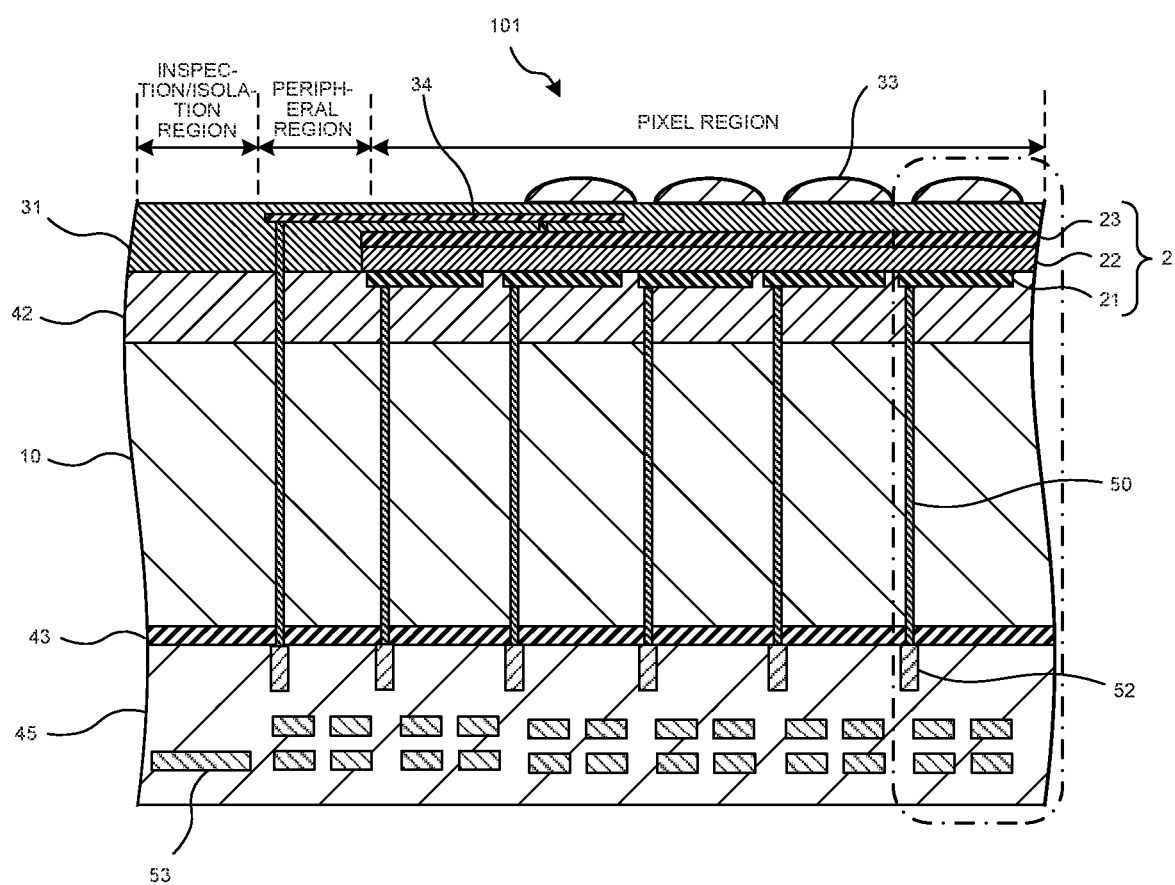
FIG. 11 is a cross-sectional explanatory diagram of the solid-state imaging apparatus according to the present disclosure.

FIG. 10 is a planar explanatory diagram of a solid-state imaging apparatus according to the present disclosure. FIG. 11 is a cross-sectional explanatory diagram of the solid-state imaging apparatus according to the present disclosure. In FIG. 11, the illustration of partial components of the components included in the solid-state imaging element 1 illustrated in FIG. 1 is omitted.

Note that a portion surrounded by a dashed-dotted line illustrated in FIG. 11 corresponds to the solid-state imaging element 1 illustrated in FIG. 1. Here, among the components illustrated in FIG. 11, the same components as the components illustrated in FIG. 1 are assigned the same reference numerals and hatchings as the reference numerals and hatchings illustrated in FIG. 1, and the redundant description will be therefore omitted.

As illustrated in FIG. 10, a solid-state imaging apparatus 101 includes a pixel array 102 in which a plurality of solid-state imaging elements 1 is arranged in a matrix, and a pixel driving circuit 103 and pixel readout circuits 104 and 105 that are provided around the pixel array 102. Note that a portion surrounded by a dotted line illustrated in FIG. 10 corresponds to a portion of the circuit illustrated in FIG. 9.

Figure 9:
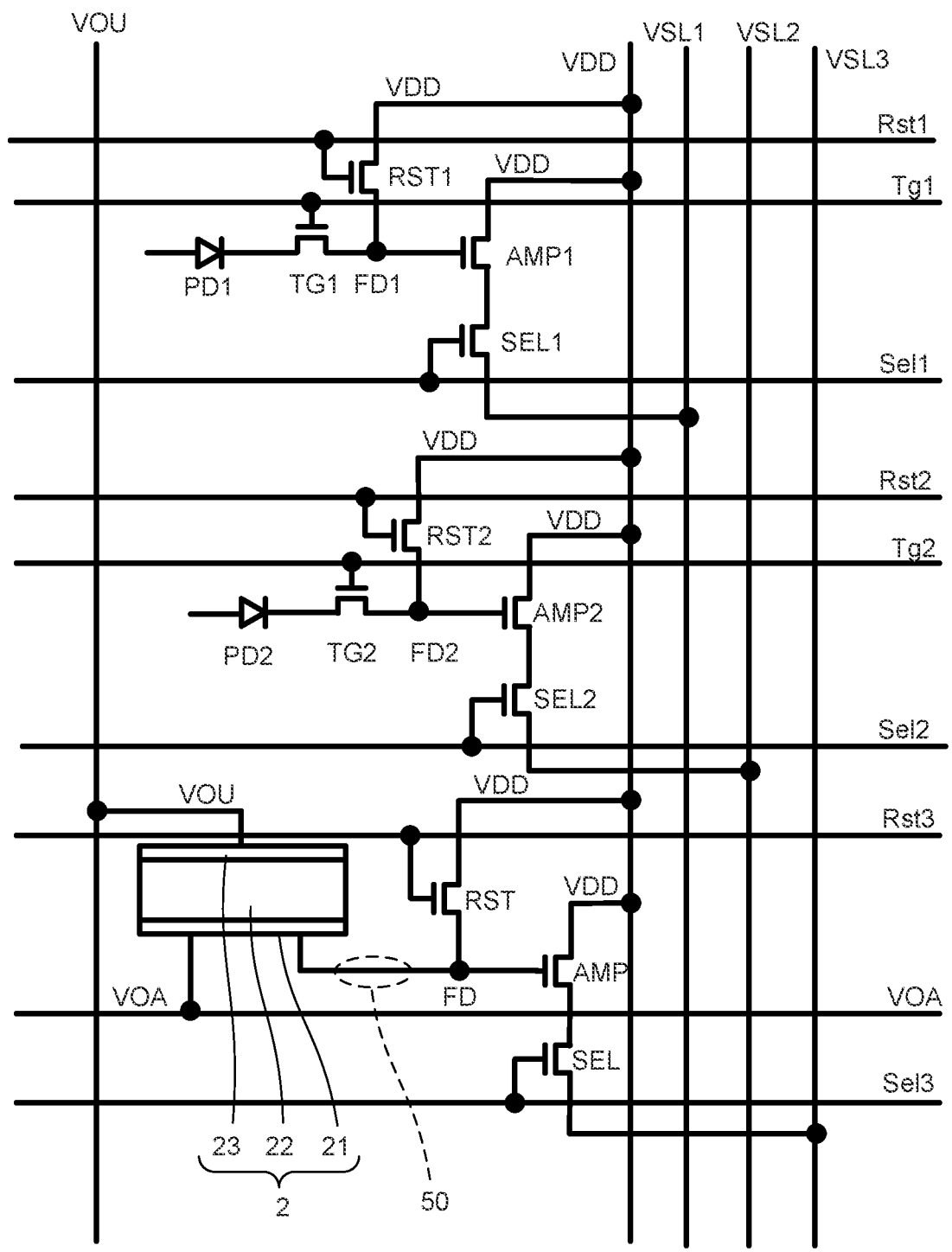
FIG. 9 is an explanatory diagram illustrating an example of a circuit configuration of the solid-state imaging element according to the present disclosure.

The pixel driving circuit 103 performs the transfer and the reset of photoelectrically converted electric charges by driving the transfer transistors TG1 and TG2, the reset transistors RST, RST1, and RST2, and the like that are illustrated in FIG. 9, for example. Furthermore, the pixel readout circuits 104 and 105 read out photoelectrically converted electric charges from the solid-state imaging element 1 by driving the selection transistors SEL, SELL, and SEL2, and the like that are illustrated in FIG. 9, for example.

In the solid-state imaging apparatus 101 according to the present disclosure, a region in which the pixel array 102 is provided is defined as a pixel area (pixel region). Specifically, as illustrated in FIG. 11, in a plane direction of the semiconductor substrate 10, the inside of a region in which a plurality of lower transparent electrodes 21 is provided is defined as a pixel area (pixel region). The penetrating electrode 50 is provided in this pixel region. Furthermore, in the solid-state imaging apparatus 101, the periphery of the pixel region becomes a peripheral region, and the outside of the peripheral region becomes an inspection/isolation region.

Note that, as illustrated in FIG. 11, the solid-state imaging apparatus 101 includes a light shielding film 34 also functioning as a VOU line that is connected with the upper transparent electrode 23, inside the passivation film 31. The light shielding film 34 also functioning as a VOU line is connected with the connection pad 52 provided on the front surface side (bottom surface side in FIG. 11) of the semiconductor substrate 10, via the penetrating electrode 50, and applies the above-described predetermined voltage VOU to the upper transparent electrode 23.

6. Modified Example 1 of Solid-State Image Sensor

Figure 12:
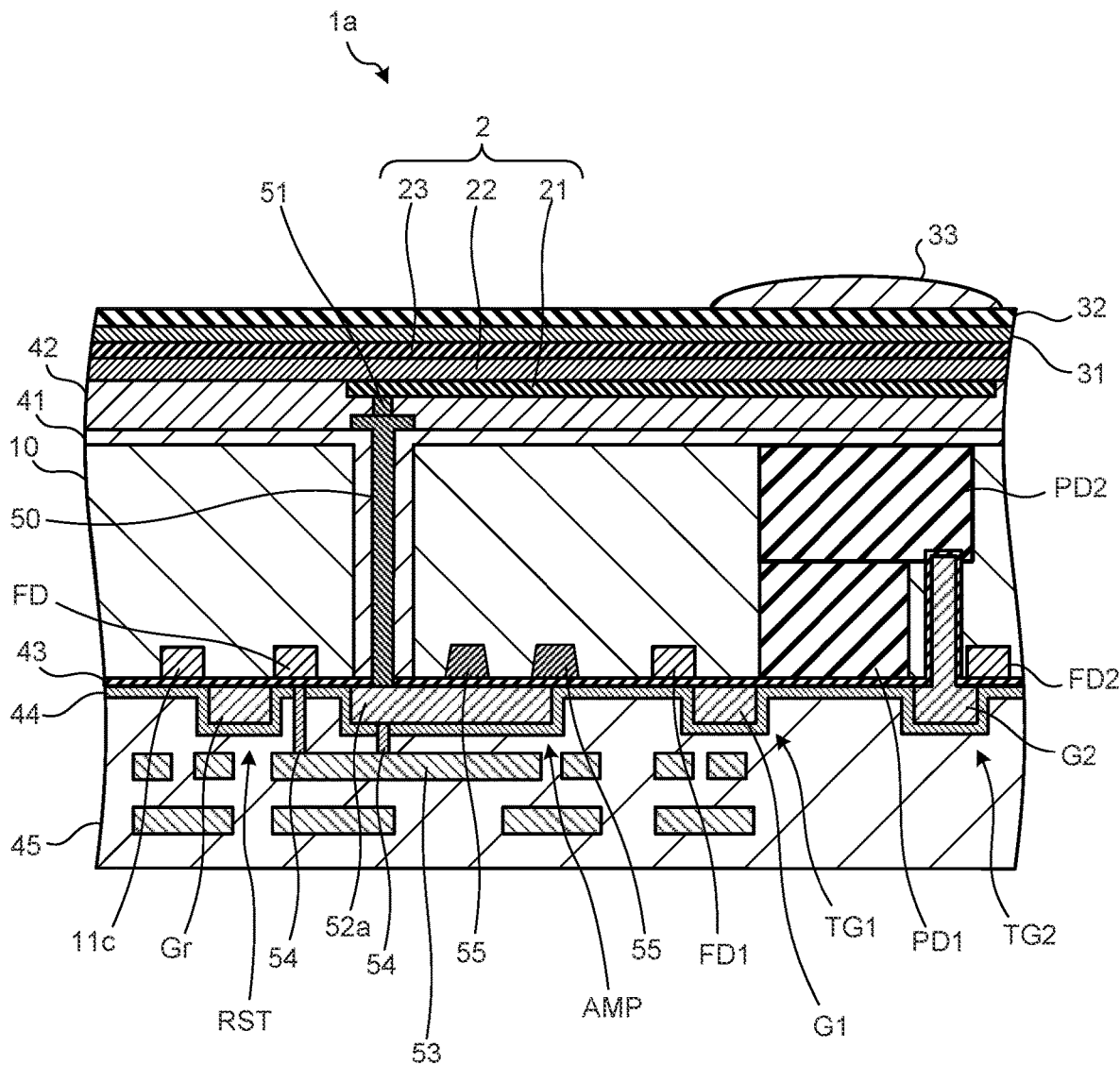
FIG. 12 is a cross-sectional explanatory diagram illustrating Modified Example 1 of the solid-state imaging element according to the present disclosure.
Figure 13:
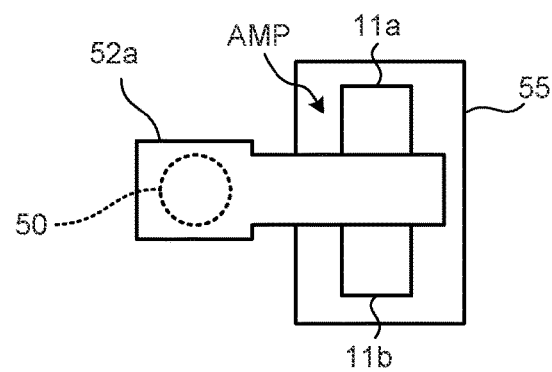
FIG. 13 is a planar explanatory diagram illustrating a connection pad in Modified Example 1 of the solid-state imaging element according to the present disclosure.

Next, Modified Example 1 of the solid-state imaging element will be described with reference to FIGS. 12 and 13. FIG. 12 is a cross-sectional explanatory diagram illustrating Modified Example 1 of the solid-state imaging element according to the present disclosure. FIG. 13 is a planar explanatory diagram illustrating a connection pad in Modified Example 1 of the solid-state imaging element according to the present disclosure.

As illustrated in FIG. 12, a solid-state imaging element 1a has a configuration similar to the configuration of the solid-state imaging element 1 illustrated in FIG. 1, except that a connection pad 52a extends up to a position facing a channel formation region of the amplification transistor AMP via the gate insulating film 43 provided on the front surface of the semiconductor substrate 10.

Note that, because FIG. 12 illustrates a cross-section of the solid-state imaging element 1a taken along a line traversing between the source 11a and the drain 11b of the amplification transistor AMP, the source 11a and the drain 11b are not illustrated in FIG. 12. An element isolation region 55 formed of insulating material such as silicon oxide, for example, is provided around the source 11a and the drain 11b of the amplification transistor AMP (refer to FIG. 13).

The connection pad 52a according to Modified Example 1 also has a function of the connection pad 52 illustrated in FIG. 1, and a function of the gate Ga of the amplification transistor AMP illustrated in FIG. 1. According to the connection pad 52a, as compared with the solid-state imaging element 1 illustrated in FIG. 1, an interval needs not be provided between the connection pad 52 and the gate Ga of the amplification transistor AMP. Thus, it is possible to increase the number of components per chip, by reducing a size in the plane direction of the semiconductor substrate 10.

Furthermore, as illustrated in FIG. 13, the connection pad 52a can have a configuration in which a connection portion with the penetrating electrode 50 and a portion functioning as a gate of the amplification transistor AMP are positioned on a straight line.

With this configuration, by minimizing a distance between the connection portion with the penetrating electrode 50 and the portion functioning as a gate of the amplification transistor AMP in the connection pad 52a, it is possible to further increase the number of components per chip.

Note that a positional relationship between the connection portion with the penetrating electrode 50 and the portion functioning as a gate of the amplification transistor AMP in the connection pad 52a is not limited to the positional relationship illustrated in FIG. 13, and can be arbitrarily changed in accordance with the layout of the solid-state imaging element 1a.

Furthermore, in the connection pad 52a, the connection portion with the penetrating electrode 50 is wider in a planar view than the portion functioning as a gate of the amplification transistor AMP. With this configuration, even in a case where the position of a through-hole for providing the penetrating electrode 50 is slightly shifted, the penetrating electrode 50 and the connection pad 52a can be surely connected. Nevertheless, the shape of the connection pad 52a in a planar view is not limited to the shape illustrated in FIG. 13.

7. Modified Example 2 of Solid-State Image Sensor

Figure 14:
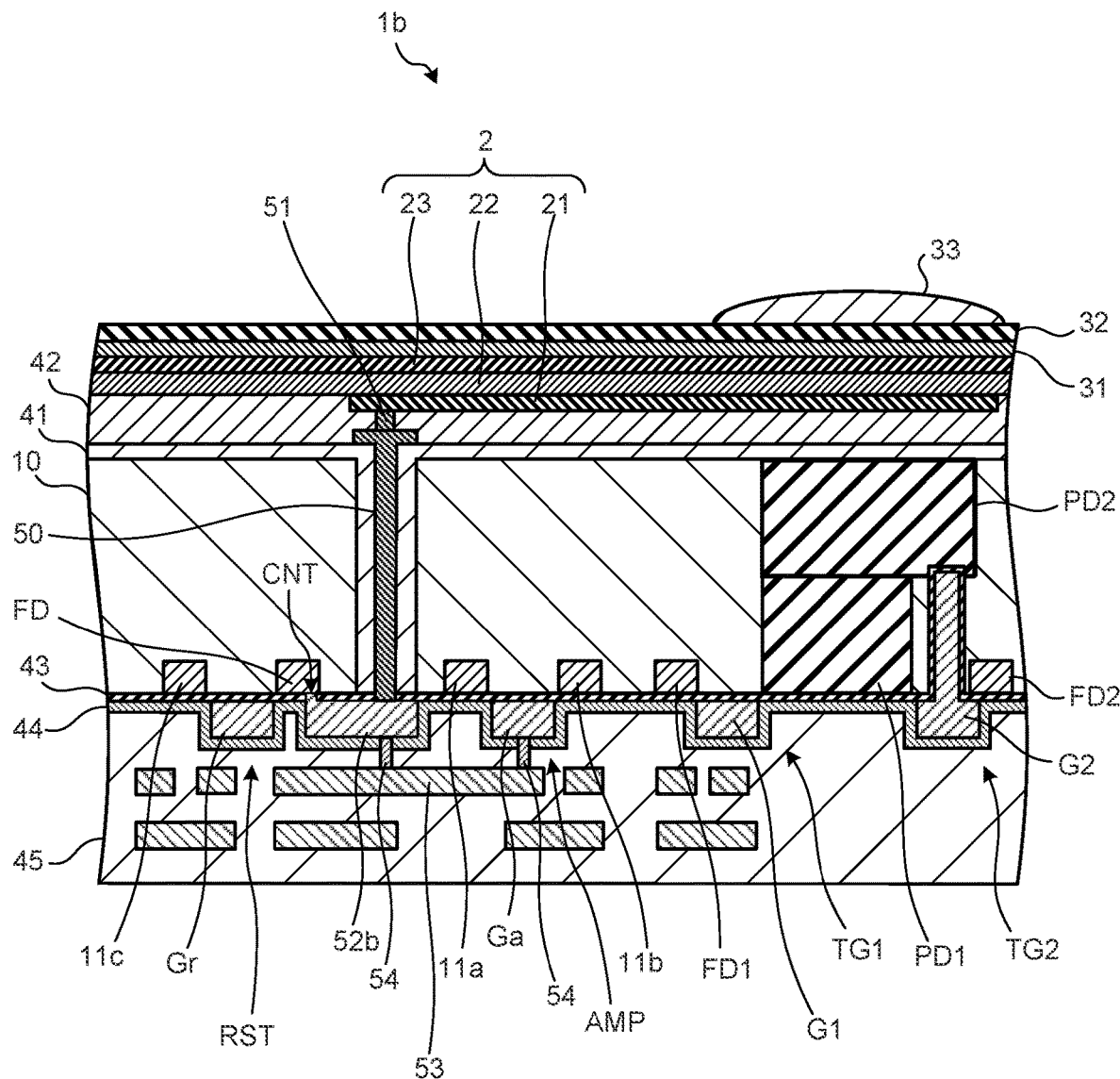
FIG. 14 is a cross-sectional explanatory diagram illustrating Modified Example 2 of the solid-state imaging element according to the present disclosure.
Figure 15:
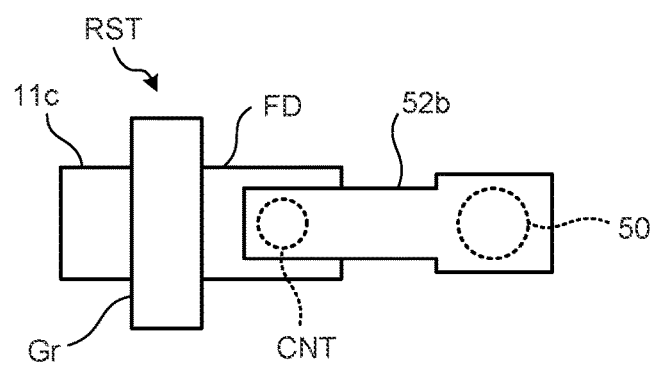
FIG. 15 is a planar explanatory diagram illustrating a connection pad in Modified Example 2 of the solid-state imaging element according to the present disclosure.

Next, Modified Example 2 of the solid-state imaging element will be described with reference to FIGS. 14 and 15. FIG. 14 is a cross-sectional explanatory diagram illustrating Modified Example 2 of the solid-state imaging element according to the present disclosure. FIG. 15 is a planar explanatory diagram illustrating a connection pad in Modified Example 2 of the solid-state imaging element according to the present disclosure.

As illustrated in FIG. 14, a solid-state imaging element 1b has a configuration similar to the configuration of the solid-state imaging element 1 illustrated in FIG. 1, except that a connection pad 52b extends up to a position contacting the floating diffusion FD.

The connection pad 52b according to Modified Example 2 is bonded with the floating diffusion FD at a contact portion CNT. According to the connection pad 52b, it is possible to suppress damages deriving when a contact via is connected to the floating diffusion FD, and a deterioration in noise characteristics that is attributed to metallic contamination.

Furthermore, as illustrated in FIG. 14, the connection pad 52b can have a configuration in which a connection portion with the penetrating electrode 50 and the contact portion CNT are positioned on a straight line. With this configuration, by minimizing a distance between the connection portion with the penetrating electrode 50 and the contact portion CNT in the connection pad 52b, it is possible to increase the number of components per chip.

Note that a positional relationship between the connection portion with the penetrating electrode 50 and the contact portion CNT in the connection pad 52b is not limited to the positional relationship illustrated in FIG. 14, and can be arbitrarily changed in accordance with the layout of the solid-state imaging element 1b.

Furthermore, in the connection pad 52b, the connection portion with the penetrating electrode 50 is wider in a planar view than the contact portion CNT. With this configuration, even in a case where the position of a through-hole for providing the penetrating electrode 50 is slightly shifted, the penetrating electrode 50 and the connection pad 52b can be surely connected. Nevertheless, the shape of the connection pad 52b in a planar view is not limited to the shape illustrated in FIG. 14.

Note that the connection pad 52b may have a configuration of further extending up to a position facing a channel formation region of the amplification transistor AMP via the gate insulating film 43 provided on the front surface of the semiconductor substrate 10. With this configuration, the connection pad 52b also brings about an effect according to the above-described configuration of Modified Example 1, in addition to an effect according to the above-described configuration of Modified Example 2.

8. Modified Example 3 of Solid-State Image Sensor

Figure 16:
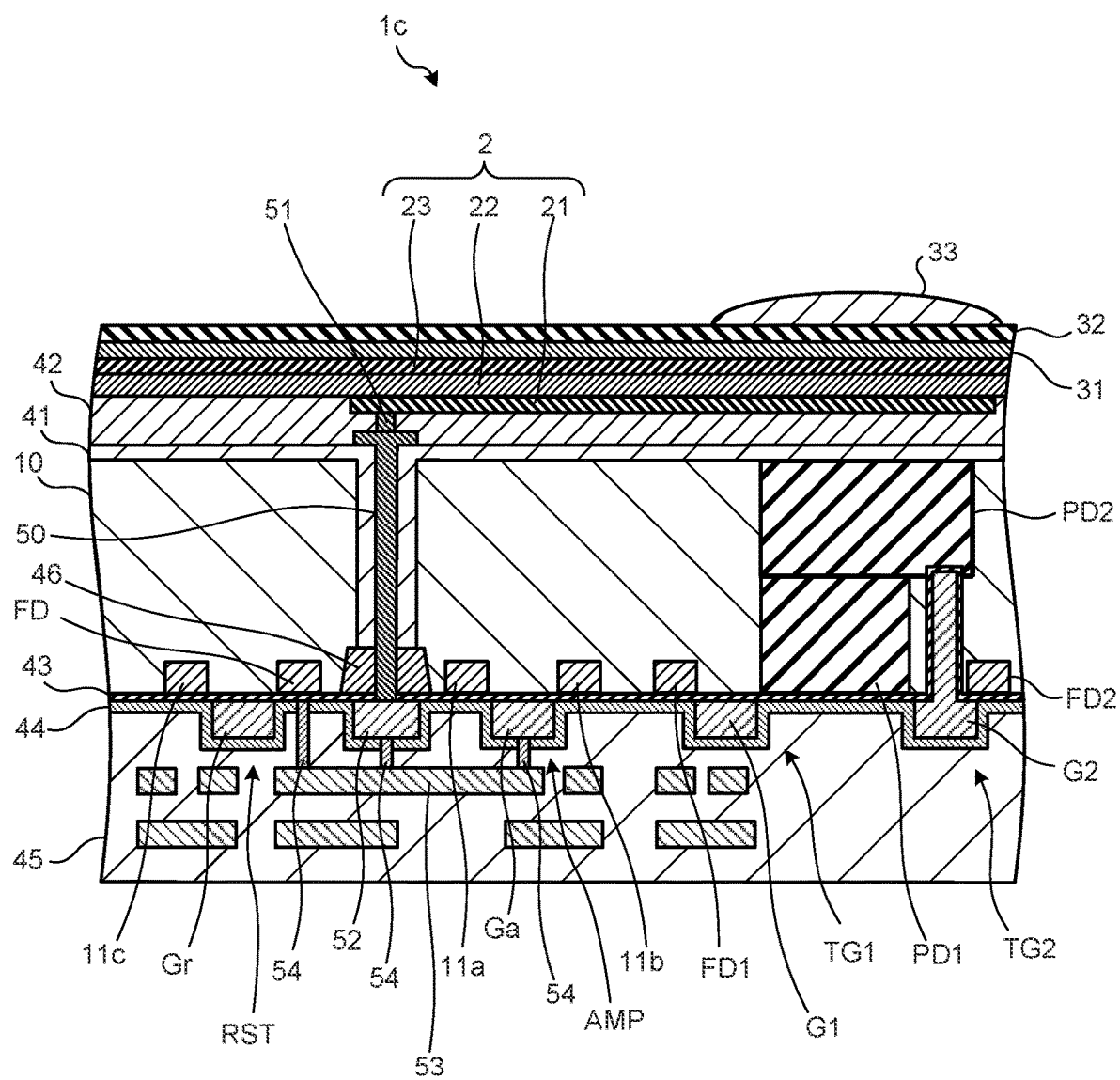
FIG. 16 is a cross-sectional explanatory diagram illustrating Modified Example 3 of the solid-state imaging element according to the present disclosure.

Next, Modified Example 3 of the solid-state imaging element will be described with reference to FIG. 16. FIG. 16 is a cross-sectional explanatory diagram illustrating Modified Example 3 of the solid-state imaging element according to the present disclosure. As illustrated in FIG. 16, a solid-state imaging element 1c has a configuration similar to the configuration of the solid-state imaging element 1 illustrated in FIG. 1, except that a Shallow Trench Isolation (STI) 46 surrounding the side circumferential surface of a different end (lower end in FIG. 16) side of the penetrating electrode 50 is included at a position facing the connection pad 52 via the gate insulating film 43 provided on the front surface of the semiconductor substrate 10.

The STI 46 is formed in a process before a process of forming a through-hole for providing the penetrating electrode 50, in the semiconductor substrate 10. Furthermore, the STI 46 is formed in such a manner that a film thickness in a thickness direction of the semiconductor substrate 10 becomes thicker than the gate insulating film 43.

Nevertheless, if a film thickness of the STI 46 in the thickness direction of the semiconductor substrate 10 (depth at which the STI 46 is buried in the semiconductor substrate 10) is too deep, a through-hole processing amount at a high aspect increases to be larger. Thus, the depth of the STI 46 is desirably set to a depth equivalent to or smaller than the depth of a different STI formed nearby.

In a case where the depth of the STI 46 is set to a depth equivalent to the depth of a different STI formed nearby, the STI 46 can be formed simultaneously with the different STI formed nearby. Thus, there is no need to add a new manufacturing process for forming the STI 46. Note that, as the material of the STI 46, the same insulating material (for example, silicon oxide) as the gate insulating film 43 can be employed.

The STI 46 functions as an etching stopper in a process of forming a through-hole for providing the penetrating electrode 50, in the semiconductor substrate 10. With this configuration, because the thickness of a film serving as an etching stopper in a process of forming a through-hole in the semiconductor substrate 10 increases in the solid-state imaging element 1c, it is possible to suppress a decline in yield ratio that is caused by the through-hole formed by etching penetrating through the gate insulating film 43.

Furthermore, by the solid-state imaging element 1c including the STI 46, a distance between the penetrating electrode 50 and the semiconductor substrate 10 can be widened. Thus, an effect of reducing wiring capacity formed between the penetrating electrode 50 and the semiconductor substrate 10 is also brought about.

Note that the STI 46 illustrated in FIG. 16 may be provided at a position surrounding the side circumferential surface on the lower end side of the penetrating electrode 50 included in the solid-state imaging element 1 illustrated in FIG. 1, the solid-state imaging element 1a illustrated in FIG. 12, the solid-state imaging element 1b illustrated in FIG. 14, and a solid-state imaging element 1d to be described next with reference to FIG. 17.

9. Modified Example 4 of Solid-State Image Sensor

Next, Modified Example 4 of the solid-state imaging element will be described with reference to FIG. 17. FIG. 17 is a cross-sectional explanatory diagram illustrating Modified Example 4 of the solid-state imaging element according to the present disclosure. Note that FIG. 17 illustrates the solid-state imaging element 1d in a portion corresponding to two pixels in the pixel area.

Figure 17:
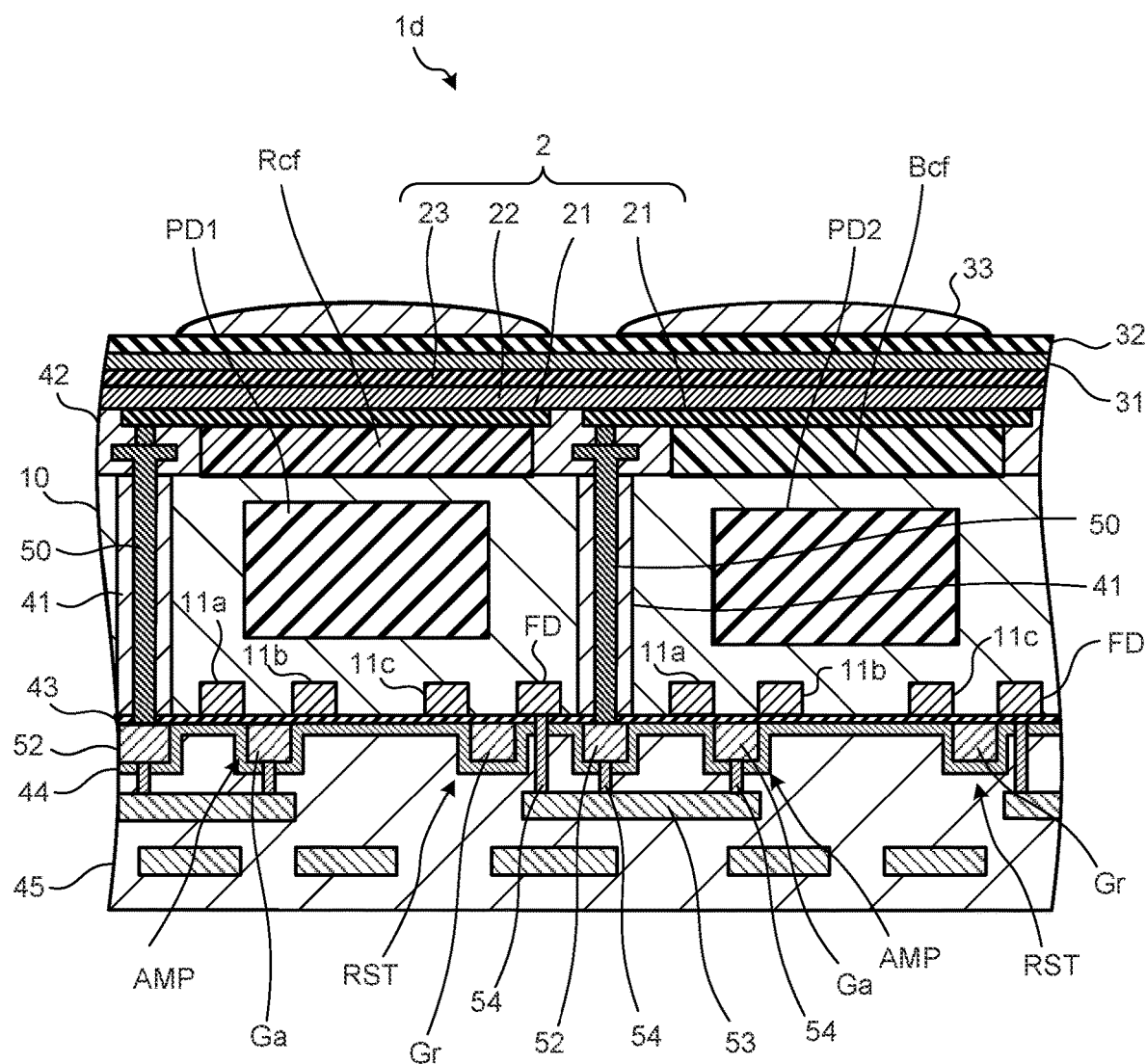
FIG. 17 is a cross-sectional explanatory diagram illustrating Modified Example 4 of the solid-state imaging element according to the present disclosure.

As illustrated in FIG. 17, the solid-state imaging element 1d has a configuration in which color filters Rcf and Bcf are included between the semiconductor substrate 10 and the lower transparent electrode 21 of the photoelectric conversion layer 2, and the first photoelectric conversion element PD1 is provided in the left pixel and the second photoelectric conversion element PD2 is provided in the right pixel.

Specifically, the color filter Rcf provided in the left pixel illustrated in FIG. 17 selectively lets through red light. Furthermore, the color filter Bcf provided in the right pixel illustrated in FIG. 17 selectively lets through blue light.

With this configuration, the first photoelectric conversion element PD1 inside the semiconductor substrate 10 in the left pixel photoelectrically converts red light. Furthermore, the second photoelectric conversion element PD2 inside the semiconductor substrate 10 in the right pixel photoelectrically converts blue light.

The plurality of first photoelectric conversion elements PD1 and the plurality of second photoelectric conversion elements PD2 are arrayed in a matrix in the plane direction of the semiconductor substrate 10. Furthermore, the photoelectric conversion layer 2 of the solid-state imaging element 1d is shared by all pixels, and photoelectrically converts green light.

In addition, the solid-state imaging element 1d includes, for each pixel, the penetrating electrode 50 and the connection pad 52 having the same configurations as those of the solid-state imaging element 1 illustrated in FIG. 1. Specifically, the penetrating electrode 50 is connected at one end (here, upper end) to the lower transparent electrode 21 of the photoelectric conversion layer 2 to penetrate through the semiconductor substrate 10.

In addition, the connection pad 52 is provided on the same layer as the gate Ga of the amplification transistor AMP, the gate Gr of the reset transistor RST, and the like that are provided on the front surface side of the semiconductor substrate 10, and the different end (here, lower end) of the penetrating electrode 50 is connected to the connection pad 52.

In this manner, the penetrating electrode 50 according to the present disclosure can also be applied to the solid-state imaging element 1d having a configuration in which the photoelectric conversion layer 2 that photoelectrically converts green light is included on the back surface side of the semiconductor substrate 10, and the first photoelectric conversion element PD1 that photoelectrically converts red light and the second photoelectric conversion element PD2 that photoelectrically converts blue light are arrayed inside the semiconductor substrate 10.

Note that, heretofore, the solid-state imaging elements 1, 1a, 1b, 1c, and 1d that include one photoelectric conversion layer 2 on the back surface side of the semiconductor substrate 10 have been described as examples. However, the penetrating electrode 50 and the connection pad 52 according to the present disclosure can also be applied to a solid-state imaging apparatus including two or more photoelectric conversion layers 2 on the back surface side of the semiconductor substrate 10.

Furthermore, the penetrating electrode 50 and the connection pad 52 according to the present disclosure can also be applied to a solid-state imaging element having a configuration in which a region of a photoelectric conversion layer that photoelectrically converts green light, a region of a photoelectric conversion layer that photoelectrically converts red light, and a region of a photoelectric conversion layer that photoelectrically converts blue light are arrayed in Bayer arrangement on the same plane as the back surface side of the semiconductor substrate 10.

10. Configuration of Electronic Device Including Solid-State Image Sensor

Figure 18:
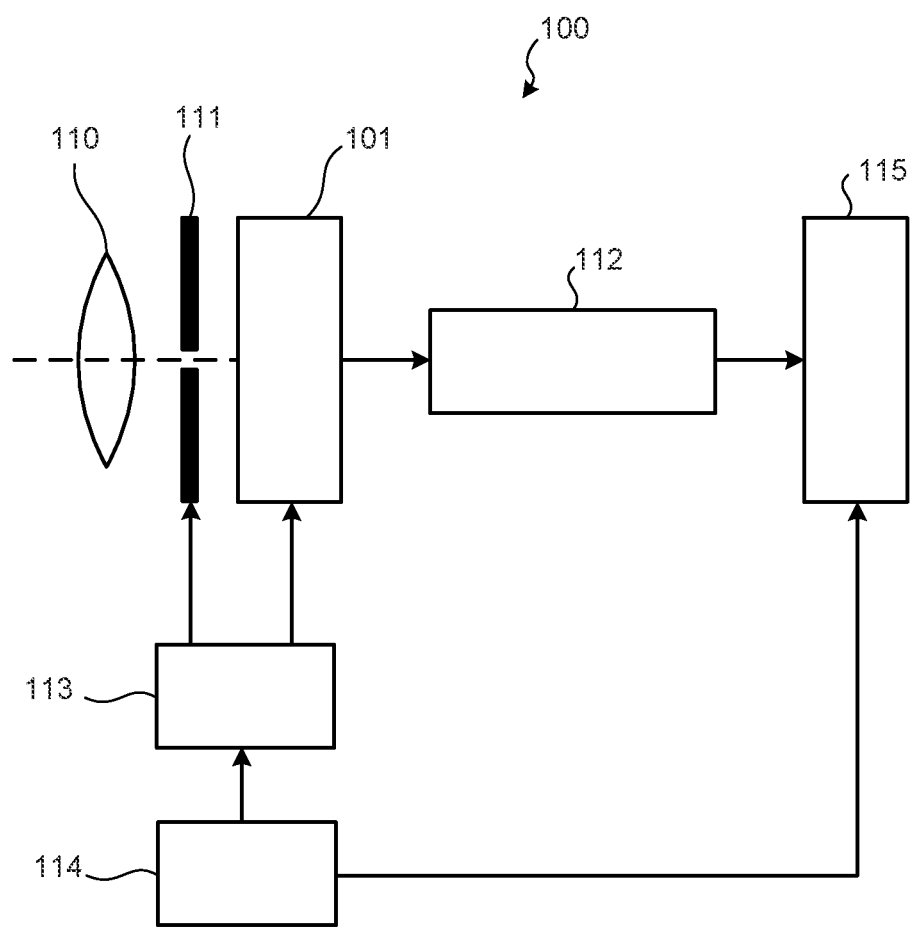
FIG. 18 is an explanatory diagram illustrating an example of a configuration of an electronic device according to the present disclosure.

Next, an example of a configuration of an electronic device including the solid-state imaging element according to the present disclosure will be described with reference to FIG. 18. FIG. 18 is an explanatory diagram illustrating an example of a configuration of an electronic device according to the present disclosure. An electronic device 100 illustrated in FIG. 18 is a camera that includes the solid-state imaging apparatus 101 including a plurality of solid-state imaging elements according to the present disclosure as imaging pixels, and can capture a still image or a moving image.

As illustrated in FIG. 18, the electronic device 100 includes the solid-state imaging apparatus 101, an optical system (imaging lens) 110, a shutter device 111, a driving unit 113 that drives the solid-state imaging apparatus 101 and the shutter device 111, a signal processing unit 112, a user interface 114, and a monitor 115.

The optical system 110 guides image light (incident light) from a subject, to a light reception unit of the solid-state imaging apparatus 101. Note that the optical system 110 may include a plurality of optical lenses. The shutter device 111 controls an exposure period of the solid-state imaging apparatus 101. The driving unit 113 controls a transfer operation of the solid-state imaging apparatus 101 and a shutter operation of the shutter device 111.

The signal processing unit 112 performs various types of signal processing on a signal output from the solid-state imaging apparatus 101. A video signal having been subjected to signal processing is output to the monitor 115. Note that the video signal may be stored in a storage medium such as a memory.

The user interface 114 can perform the designation of an imaging scene, such as the designation of a dynamic range or the designation of a wavelength (terahertz, visible wavelength, infrared wavelength, ultraviolet wavelength, X-ray, or the like). The designation (input signal from the user interface 114) is input to the driving unit 113, and an image is captured by the solid-state imaging apparatus 101 on the basis of the designation.

Figure 19:
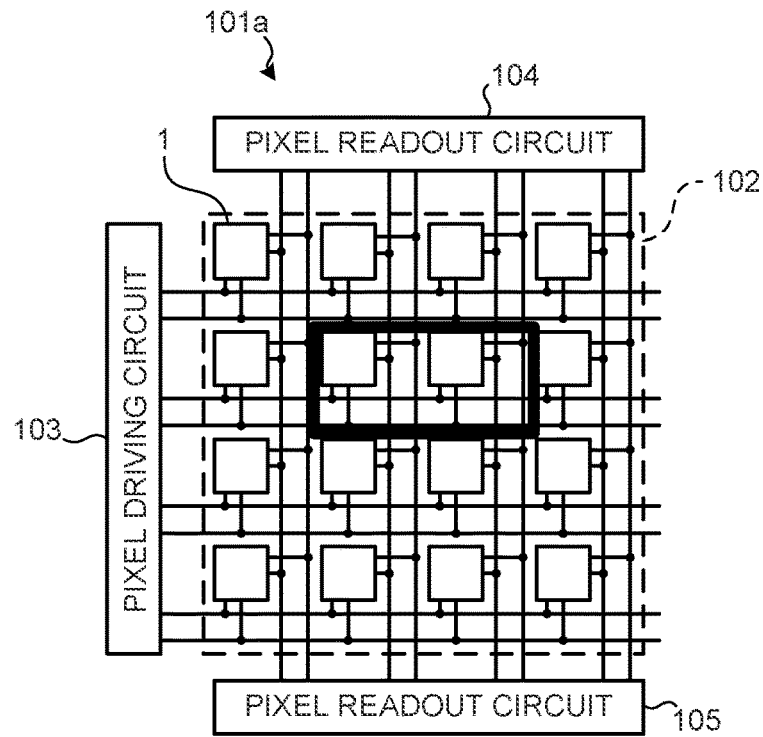
FIG. 19 is a planar explanatory diagram illustrating Modified Example 1 of the solid-state imaging apparatus according to the present disclosure.
Figure 20:
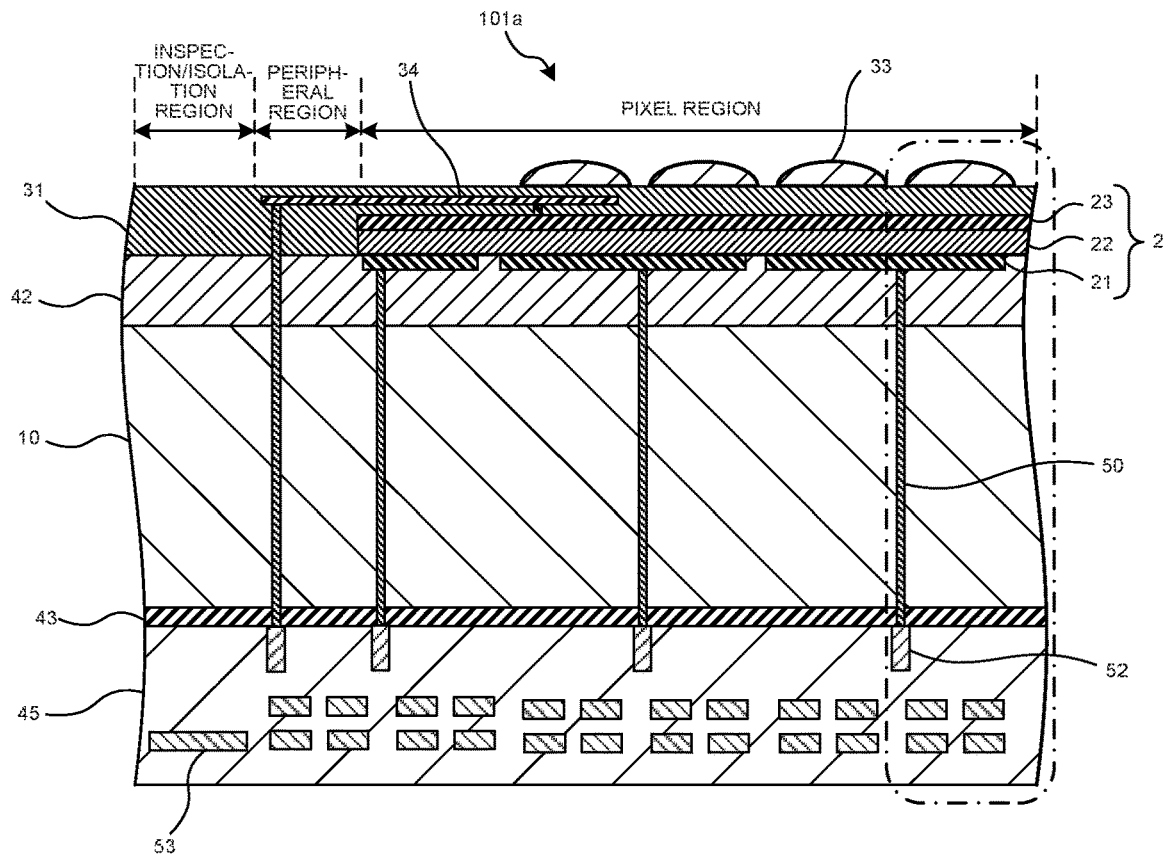
FIG. 20 is a cross-sectional explanatory diagram illustrating Modified Example 1 of the solid-state imaging apparatus according to the present disclosure.
Figure 21:
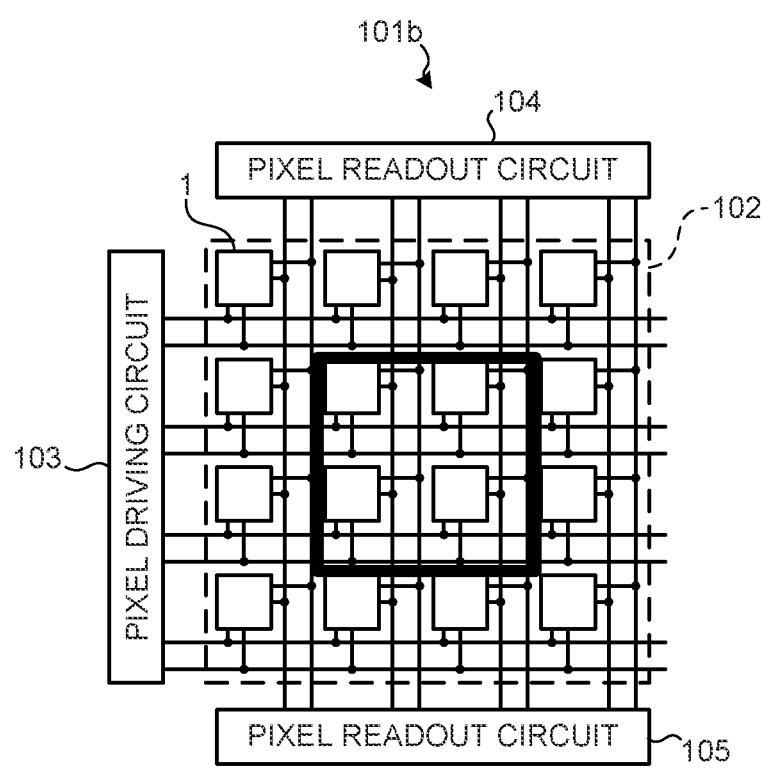
FIG. 21 is a planar explanatory diagram illustrating Modified Example 2 of the solid-state imaging apparatus according to the present disclosure.

11. Modified Example 1 and Modified Example 2 of Solid-State Imaging Apparatus Next, Modified Example 1 and Modified Example 2 of solid-state imaging apparatus will be described with reference to FIGS. 19, 20, and 21. FIG. 19 is a planar explanatory diagram illustrating Modified Example 1 of the solid-state imaging apparatus according to the present disclosure. FIG. 20 is a cross-sectional explanatory diagram illustrating Modified Example 1 of the solid-state imaging apparatus according to the present disclosure. FIG. 21 is a planar explanatory diagram illustrating Modified Example 2 of the solid-state imaging apparatus according to the present disclosure.

Note that, here, among the components illustrated in FIGS. 19 and 21, components having functions the same as or similar to the components illustrated in FIG. 10 are assigned the same reference numerals as the reference numerals illustrated in FIG. 10, and the redundant description will be therefore omitted.

Furthermore, among the components illustrated in FIG. 20, components having functions the same as or similar to the components illustrated in FIG. 11 are assigned the same reference numerals and hatchings as the reference numerals and the hatching illustrated in FIG. 11, and the redundant description will be therefore omitted.

In the above-described embodiment, the solid-state imaging apparatus 101 in which the penetrating electrode 50 is provided for each pixel has been described as an example, but the solid-state imaging apparatus according to the present disclosure may have a configuration in which one penetrating electrode 50 is shared by a plurality of pixels.

For example, as illustrated in FIG. 19, a solid-state imaging apparatus 101a according to Modified Example 1 has a configuration in which one penetrating electrode 50 is shared by two adjacently-provided pixels surrounded by a thick frame in this drawing. In the case of this configuration, as illustrated in FIG. 20, the solid-state imaging apparatus 101a includes the lower transparent electrode 21 extending over the two adjacently-provided pixels, and the shared penetrating electrode 50 is provided between the two adjacently-provided pixels.

With this configuration, the solid-state imaging apparatus 101a can reduce the number of penetrating electrodes 50, and an interval between pixels that do not share the penetrating electrode 50 can be narrowed by the reduction amount. Thus, the density of the pixel array 102 can be increased.

Furthermore, as illustrated in FIG. 21, a solid-state imaging apparatus 101b according to Modified Example 2 has a configuration in which one penetrating electrode 50 is shared by four adjacently-provided pixels surrounded by a thick frame in this drawing. In the case of this configuration, the solid-state imaging apparatus 101b includes the lower transparent electrode 21 extending over the four adjacently-provided pixels, and the shared penetrating electrode 50 is provided at the center of a region in which the four adjacently-provided pixels are arranged. With this configuration, the solid-state imaging apparatus 101b can further increase the density of the pixel array 102.

Note that, in both of the solid-state imaging apparatus 101a illustrated in FIG. 19 and the solid-state imaging apparatus 101b illustrated in FIG. 21, the penetrating electrode 50 connecting the lower transparent electrode 21 and the connection pad 52 is provided in a pixel region similarly to the solid-state imaging apparatus 101 illustrated in FIG. 10.

12. Example of Application to Endoscopic Operation System

The technology according to the present disclosure (present technology) can be applied to various products. For example, the technology according to the present disclosure can be applied to an endoscopic surgery system.

Figure 22:
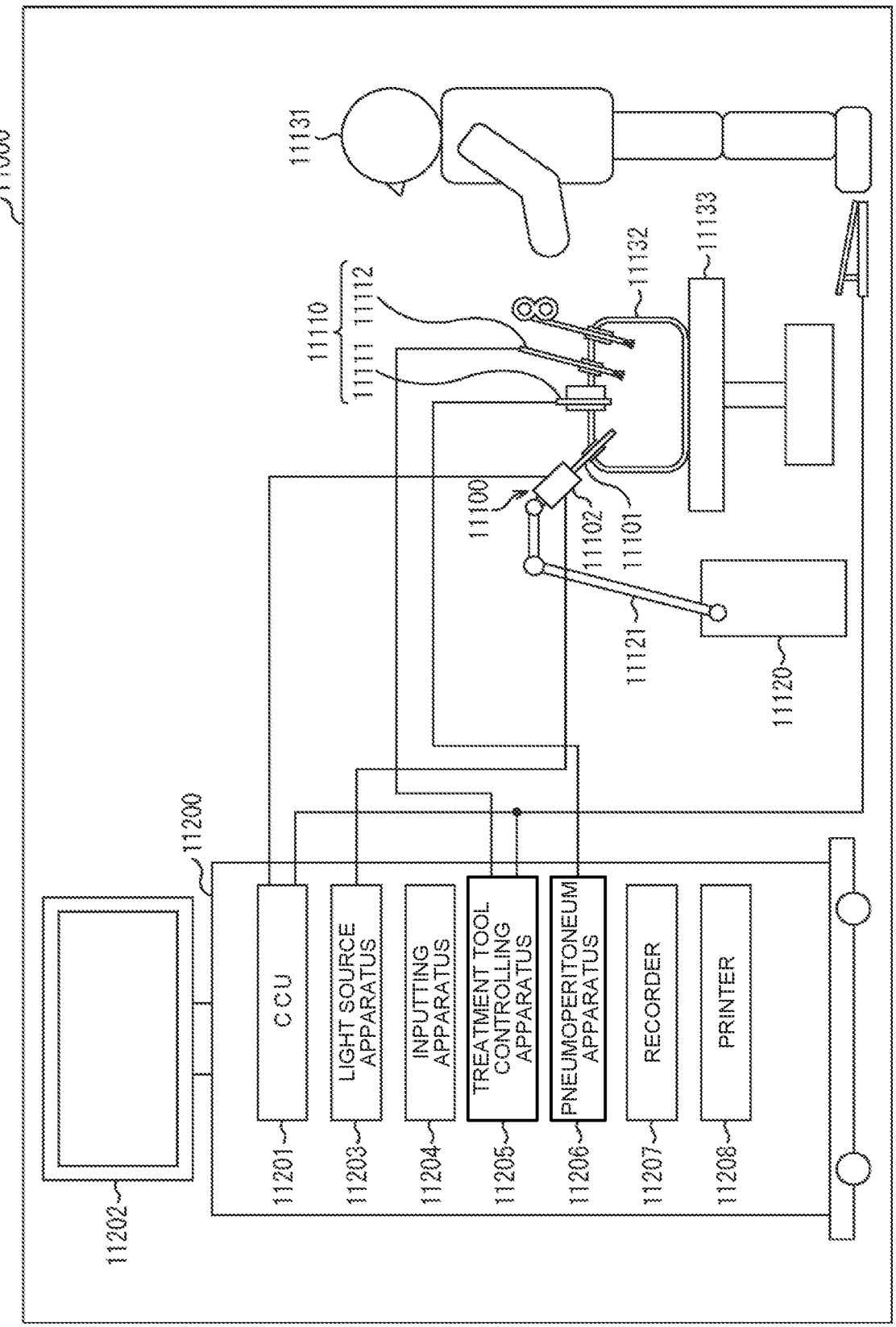
FIG. 22 is a view illustrating an example of a schematic configuration of an endoscopic surgery system.

FIG. 22 is a view depicting an example of a schematic configuration of an endoscopic surgery system to which the technology according to the present disclosure (present technology) can be applied.

In FIG. 22, a state is illustrated in which a surgeon (medical doctor) 11131 performs surgery for a patient 11132 on a patient bed 11133 with an endoscopic surgery system 11000. The endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted, as illustrated in the drawing.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is included as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100. The light generated by the light source apparatus 11203 is guided to a distal end of the lens barrel 11101 by a light guide extending in the inside of the lens barrel 11101, and an observation target in a body cavity of the patient 11132 is irradiated with the light through the objective lens. It is to be noted that the endoscope 11100 may be a forward-viewing endoscope or may be an oblique-viewing endoscope or a side-viewing endoscope.

An optical system and an imaging element are provided in the inside of the camera head 11102 such that reflected light (observation light) from the observation target is condensed on the imaging element by the optical system. The observation light is photo-electrically converted by the imaging element to generate an electric signal corresponding to the observation light, namely, an image signal corresponding to an observation image. The image signal is transmitted as RAW data to a camera control unit (CCU) 11201.

The CCU 11201 includes a central processing unit (CPU), a graphics processing unit (GPU), or the like and integrally controls operation of the endoscope 11100 and a display apparatus 11202. Further, the CCU 11201 receives an image signal from the camera head 11102 and performs, for the image signal, various image processes for displaying an image based on the image signal such as a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light in imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user inputs an instruction or a like to change an image capturing condition (type of irradiation light, magnification, focal distance, or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image, or a graph.

It is to be noted that the light source apparatus 11203 which supplies irradiation light when a surgical region is to be imaged to the endoscope 11100 may include a white light source including for example, an LED, a laser light source, or a combination of them. When a white light source includes a combination of red, green, and blue (RGB) laser light sources, the output intensity and the output timing can be controlled with a high degree of accuracy for each color (each wavelength). As a result, adjustment of the white balance of a captured image can be performed by the light source apparatus 11203. Further, in this case, when an observation target is irradiated with laser beams from the respective RGB laser light sources time-divisionally and driving of the imaging elements of the camera head 11102 is controlled in synchronism with the irradiation timings, images individually corresponding to the R, G and B colors can be also captured time-divisionally. According to this method, a color image can be obtained even if color filters are not provided for the imaging element.

Further, the light source apparatus 11203 may be controlled such that the intensity of light to be outputted is changed for each predetermined time. By controlling driving of the imaging element of the camera head 11102 in synchronism with the timing of changing the intensity of light to acquire images time-divisionally and synthesizing the images. An image with a high dynamic range free from underexposed blocked up shadows and overexposed highlights can be thus created.

Further, the light source apparatus 11203 may be configured to supply light of a predetermined wavelength band suitable for special light observation. In special light observation, for example, by irradiation of light of a narrower band in comparison with irradiation light in ordinary observation (namely, white light) by utilizing the wavelength dependency of absorption of light in a body tissue, narrow band observation (narrow band imaging) of imaging a predetermined tissue such as a blood vessel of a superficial portion of the mucous membrane in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating the body tissue with excitation light (autofluorescence observation) or to obtain a fluorescent light image by locally injecting a reagent such as indocyanine green (ICG) into a body tissue and irradiating the body tissue with excitation light corresponding to a fluorescent light wavelength of the reagent. The light source apparatus 11203 can be configured to supply such narrow-band light and/or excitation light suitable for special light observation as described above.

Figure 23:
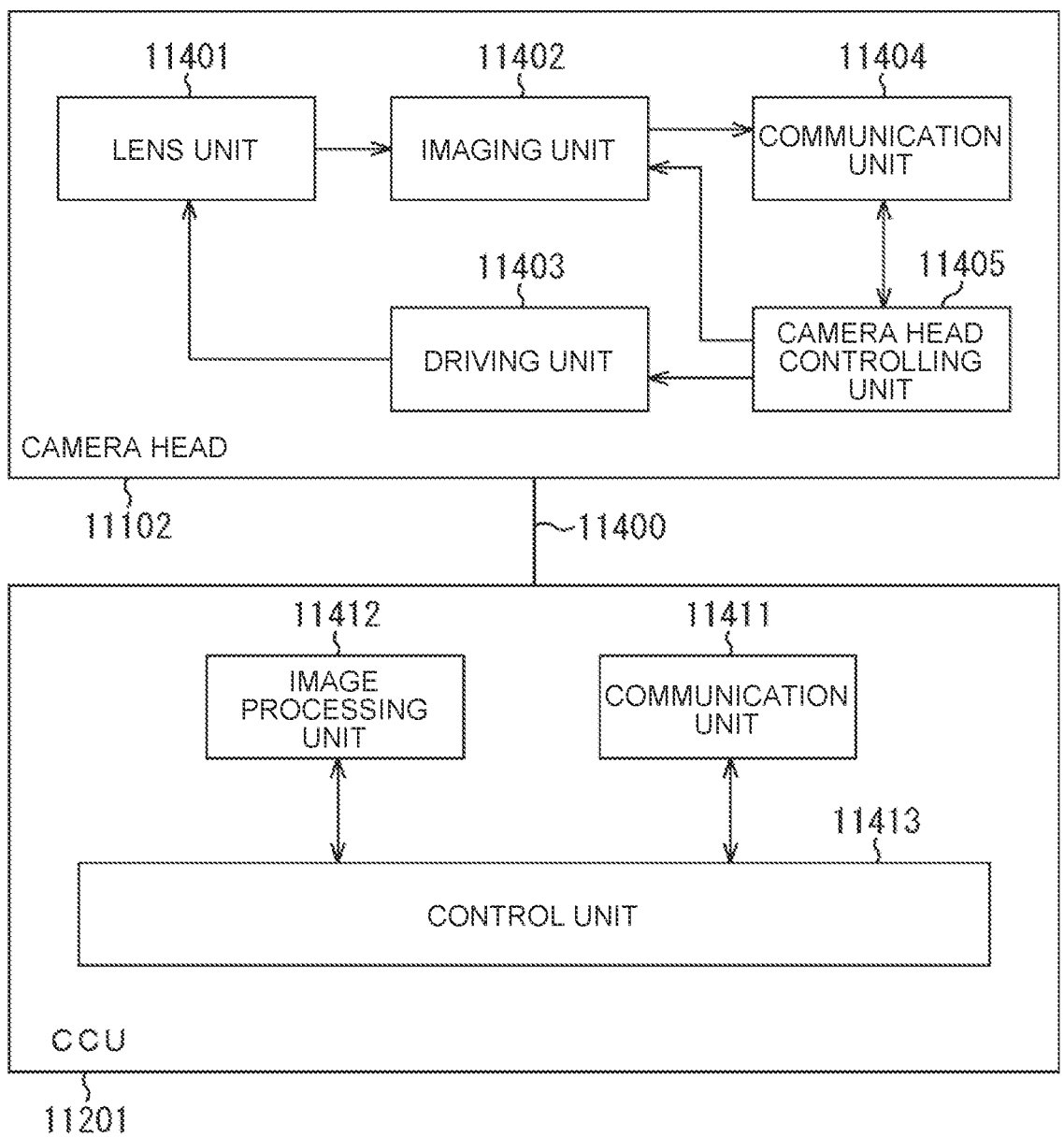
FIG. 23 is a block diagram illustrating an example of a functional configuration of a camera head and a camera control unit (CCU).

FIG. 23 is a block diagram depicting an example of a functional configuration of the camera head 11102 and the CCU 11201 depicted in FIG. 22.

The camera head 11102 includes a lens unit 11401, an imaging unit 11402, a driving unit 11403, a communication unit 11404, and a camera head controlling unit 11405. The CCU 11201 includes a communication unit 11411, an image processing unit 11412, and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The imaging unit 11402 includes imaging elements. The number of imaging elements which is included by the imaging unit 11402 may be one (so-called single-plate type) or a plural number (so-called multi-plate type). When the imaging unit 11402 is configured as that of the multi-plate type, for example, image signals corresponding to respective R, G and B are generated by the imaging elements, and the image signals may be synthesized to obtain a color image. The imaging unit 11402 may also be configured so as to have a pair of imaging elements for acquiring respective image signals for the right eye and the left eye compatible with three dimensional (3D) display. The surgeon 11131 can comprehend more accurately the depth of a living body tissue in a surgical region with 3D display. It is to be noted that, where the imaging unit 11402 is configured as that of stereoscopic type, a plurality of lens units 11401 is provided corresponding to the individual imaging elements.

Further, the imaging unit 11402 may not necessarily be provided on the camera head 11102. For example, the imaging unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a captured image by the imaging unit 11402 can be adjusted suitably.

The communication unit 11404 includes a communication apparatus for transmitting and receiving various kinds of information to and from the CCU 11201. The communication unit 11404 transmits an image signal acquired from the imaging unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image capturing conditions such as information that a frame rate of a captured image is designated, information that an exposure value upon image capturing is designated, and/or information that a magnification and a focal point of a captured image are designated.

It is to be noted that the image capturing conditions such as the frame rate, exposure value, magnification, or focal point may be appropriately designated by the user or may be set automatically by the control unit 11413 of the CCU 11201 on the basis of an acquired image signal. In the latter case, an auto exposure (AE) function, an auto focus (AF) function, and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication, or the like.

The image processing unit 11412 performs various image processes for an image signal being RAW data transmitted thereto from the camera head 11102.

The control unit 11413 performs various kinds of control relating to image capturing of a surgical region or the like by the endoscope 11100 and display of a captured image obtained by image capturing of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a captured image in which the surgical region or the like is imaged. Thereupon, the control unit 11413 may recognize various objects in the captured image using various image recognition technologies. For example, the control unit 11413 can recognize a surgical tool such as forceps, a particular living body region, bleeding, mist when the energy device 11112 is used, and so forth by detecting the shape, color, and so forth of edges of objects included in a captured image. When controlling the display apparatus 11202 to display a captured image, the control unit 11413 may cause various kinds of surgery supporting information to be displayed in an overlapping manner with an image of the surgical region using a result of the recognition. When surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable compatible with communication of an electric signal, an optical fiber compatible with optical communication, or a composite cable compatible with both of electrical and optical communications.

Here, in the example depicted, communication is performed by wired communication using the transmission cable 11400, but the communication between the camera head 11102 and the CCU 11201 may be performed by wireless communication.

Hereinabove, an example of an endoscopic surgery system to which the technology according to the present disclosure can be applied is described. The technology according to the present disclosure can be applied to, of the configuration described above, the imaging unit 11402 of the camera head 11102. Specifically, for example, the solid-state imaging element 1 illustrated in FIG. 1 can be applied to the imaging unit 10402. By applying the technology according to the present disclosure to the imaging unit 10402, the imaging unit 10402 can be further miniaturized and sophisticated. It therefore becomes possible to capture a higher-quality image of a diseased part while reducing the burden on the body of the patient 11132.

Note that, although the endoscopic surgery system has been described as an example herein, the technology according to the present disclosure may also be applied to others, for example, a microscope surgery system, and the like.

13. Example of Application to Movable Body

The technology according to the present disclosure (present technology) may be implemented as apparatuses mounted on any type of mobile bodies such as automobiles, electric vehicles, hybrid electric vehicles, motorcycles, bicycles, personal mobilities, airplanes, drones, ships, and robots.

Figure 24:
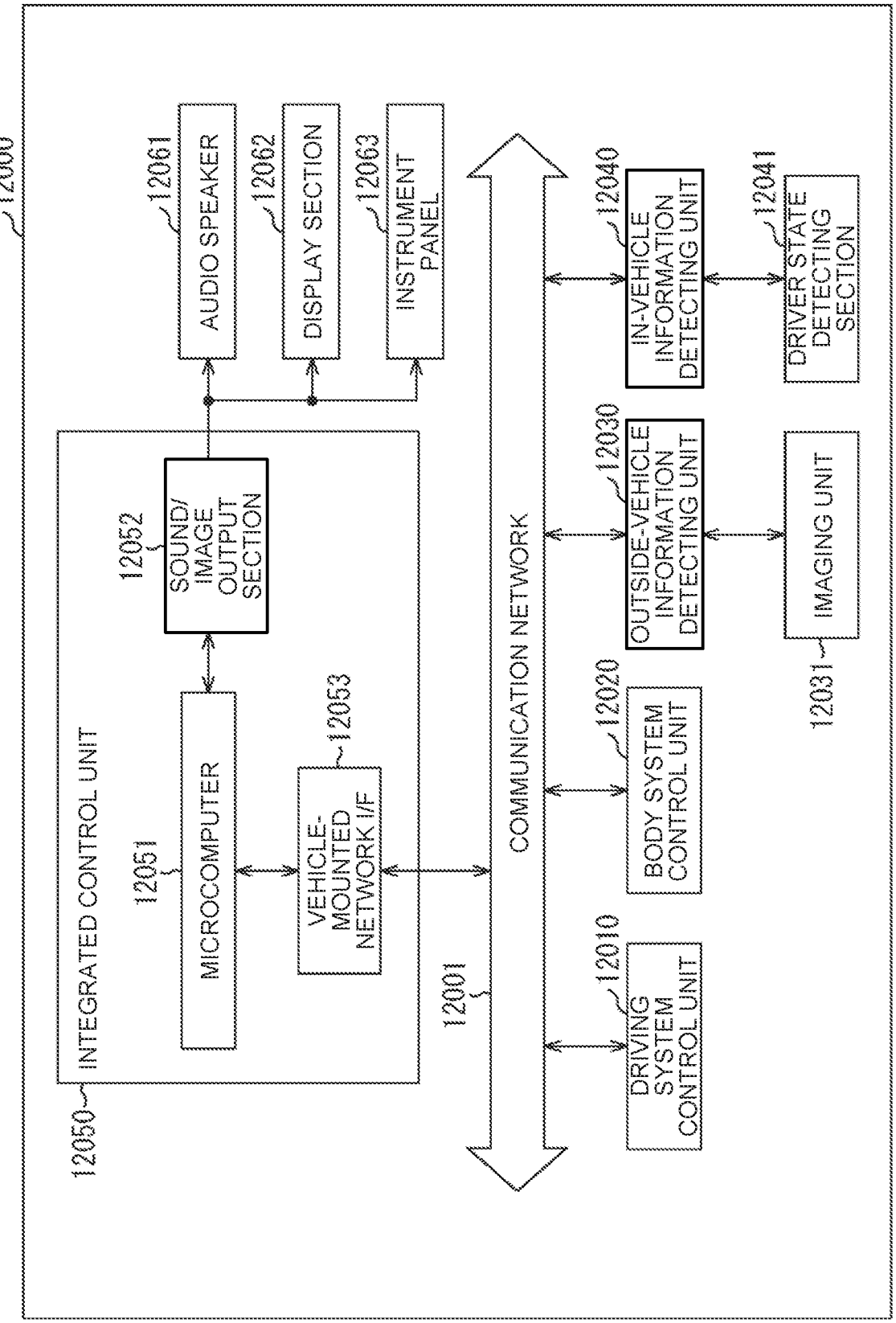
FIG. 24 is a block diagram illustrating an example of schematic configuration of a vehicle control system.

FIG. 24 is a block diagram depicting an example of schematic configuration of a vehicle control system as an example of a mobile body control system to which the technology according to the present disclosure can be applied.

A vehicle control system 12000 includes a plurality of electronic control units connected to each other via a communication network 12001. In the example depicted in FIG. 24, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine or a driving motor, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, or a fog lamp. In this case, radio waves transmitted from a mobile device as an alternative to a key or signals of various kinds of switches can be input to the body system control unit 12020. The body system control unit 12020 receives input of these radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging unit 12031. The outside-vehicle information detecting unit 12030 makes the imaging unit 12031 image an image of the outside of the vehicle, and receives the imaged image. On the basis of the received image, the outside-vehicle information detecting unit 12030 may perform processing of detecting an object such as a human, a vehicle, an obstacle, a sign, or a character on a road surface, or processing of detecting a distance thereto.

The imaging unit 12031 is an optical sensor that receives light and outputs an electric signal corresponding to a received light amount of the light. The imaging unit 12031 can output the electric signal as an image, or can output the electric signal as information about a measured distance. In addition, the light received by the imaging unit 12031 may be visible light, or may be invisible light such as infrared rays.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) including collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the surrounding of the vehicle obtained by the outside-vehicle information detecting unit 12030 or the in-vehicle information detecting unit 12040.

In addition, the microcomputer 12051 can output a control command to the body system control unit 12020 on the basis of the information about the outside of the vehicle obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying information to an occupant of the vehicle or the outside of the vehicle. In the example of FIG. 24, an audio speaker 12061, a display section 12062, and an instrument panel 12063 are illustrated as the output device. The display section 12062 may, for example, include at least one of an on-board display or a head-up display.

Figure 25:
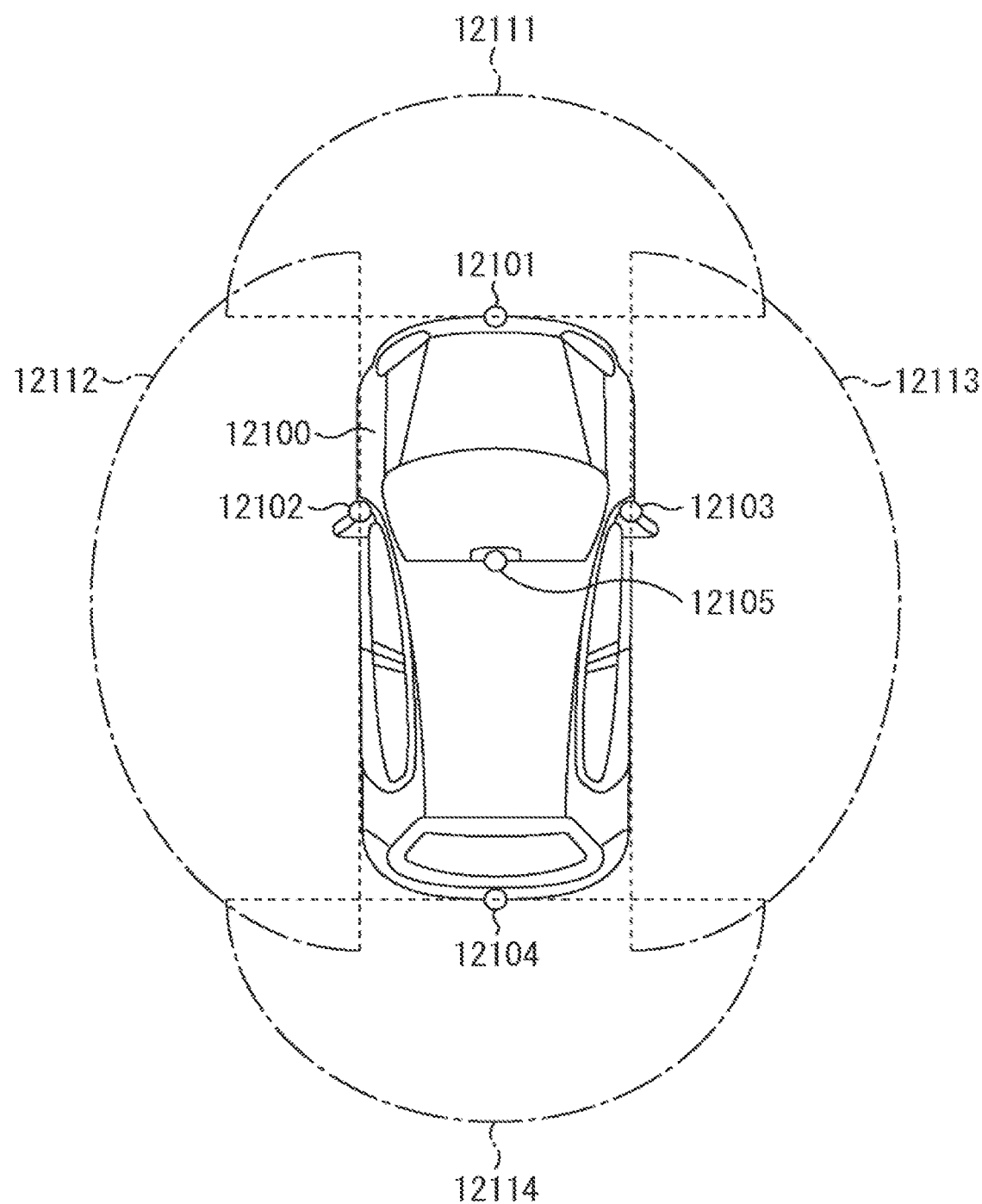
FIG. 25 is an explanatory diagram illustrating an example of installation positions of an outside-vehicle information detecting section and an imaging unit.

FIG. 25 is a diagram depicting an example of the installation position of the imaging unit 12031.

In FIG. 25, the vehicle 12100 includes imaging units 12101, 12102, 12103, 12104, and 12105 as the imaging unit 12031.

The imaging units 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging unit 12101 provided to the front nose and the imaging unit 12105 provided to the upper portion of the windshield within the interior of the vehicle obtain mainly an image of the front of the vehicle 12100. The imaging units 12102 and 12103 provided to the sideview mirrors obtain mainly an image of the sides of the vehicle 12100. The imaging unit 12104 provided to the rear bumper or the back door obtains mainly an image of the rear of the vehicle 12100. The images taking the front of the vehicle and obtained by the imaging units 12101 and 12105 are used mainly to detect a preceding vehicle, a pedestrian, an obstacle, a signal, a traffic sign, a lane, or the like.

Incidentally, FIG. 25 depicts an example of imaging ranges of the imaging units 12101 to 12104. An imaging range 12111 represents the imaging range of the imaging unit 12101 provided to the front nose. Imaging units 12112 and 12113 represent the imaging ranges of the imaging units 12102 and 12103 provided to the sideview mirrors, respectively. An imaging range 12114 represents the imaging range of the imaging unit 12104 provided to the rear bumper or the back door. A bird's-eye image of the vehicle 12100 as viewed from above is obtained by superimposing image data imaged by the imaging units 12101 to 12104, for example.

At least one of the imaging units 12101 to 12104 may have a function of obtaining distance information. For example, at least one of the imaging units 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging units 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, and other three-dimensional objects such as a utility pole, on the basis of the distance information obtained from the imaging units 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging units 12101 to 12104 may be an infrared camera that detects infrared rays. The microcomputer 12051 can, for example, recognize a pedestrian by determining whether or not there is a pedestrian in captured images of the imaging units 12101 to 12104. Such recognition of a pedestrian is, for example, performed by a procedure of extracting characteristic points in the captured images of the imaging units 12101 to 12104 as infrared cameras and a procedure of performing pattern matching processing on a series of characteristic points representing the contour of the object to determine whether or not it is the pedestrian. When the microcomputer 12051 determines that there is a pedestrian in the captured images of the imaging units 12101 to 12104, and thus recognizes the pedestrian, the sound/image output section 12052 controls the display section 12062 so that a square contour line for emphasis is displayed so as to be superimposed on the recognized pedestrian. Furthermore, the sound/image output section 12052 may also control the display section 12062 so that an icon or the like representing the pedestrian is displayed at a desired position.

Hereinabove, an example of a vehicle control system to which the technology according to the present disclosure can be applied is described. The technology according to the present disclosure can be applied to, of the configuration described above, for example, the imaging unit 12031 or the driver state detecting section 1241. Specifically, for example, the solid-state imaging element 1 illustrated in FIG. 1 can be applied to a camera of the imaging unit 12031 and the driver state detecting section 1241. By applying the technology according to the present disclosure to an in-vehicle camera, the camera can be further miniaturized and sophisticated. Thus, restrictions on the installation position of the camera in a vehicle is eased, and it becomes possible to capture a high-quality image of a three-dimensional object existing near a vehicle or a crew of a vehicle.

Further, the effects described in the present specification are only examples and are not limitative ones, and there may be other effects.

Additionally, the present technology may also be configured as follows.

(1)
A solid-state imaging element including:
one or more photoelectric conversion layers provided on one principal surface side serving as a light incidence plane of a semiconductor substrate;
a penetrating electrode that is provided in a pixel area, connected at one end to the photoelectric conversion layer to penetrate through front and back surfaces of the semiconductor substrate, and configured to transfer an electric charge photoelectrically converted by the photoelectric conversion layer, to a different principal surface side of the semiconductor substrate; and
a connection pad that is provided on a same layer as a gate of a transistor provided on the different principal surface side of the semiconductor substrate, and to which a different end of the penetrating electrode is connected.

(2)
The solid-state imaging element according to (1), including:
a Shallow Trench Isolation (STI) that is provided at a position facing the connection pad via a gate insulating film provided on the different principal surface of the semiconductor substrate, and surrounds a side circumferential surface of the different end side of the penetrating electrode.

(3)
The solid-state imaging element according to (1) or (2), wherein
the connection pad
is connected with at least either one of a gate of a transistor configured to amplify the electric charge or a floating diffusion to which the electric charge is transferred.

(4)
The solid-state imaging element according to any one of (1) to (3), wherein
the connection pad extends up to a position facing a channel formation region of a transistor configured to amplify the electric charge, via a gate insulating film provided on the different principal surface of the semiconductor substrate, and functions as a gate of the transistor.

(5)
The solid-state imaging element according to any one of (1) to (4), wherein
the connection pad extends up to a position contacting a floating diffusion to which the electric charge is transferred, and is bonded with the floating diffusion.

(6)
The solid-state imaging element according to any one of (1) to (5), wherein material of the connection pad is same material as a gate of the transistor.

(7)
The solid-state imaging element according to any one of (1) to (6), wherein
material of the connection pad is a semiconductor doped with an impure substance.

(8)
An electronic device including:
a solid-state imaging element,
wherein the solid-state imaging element includes
one or more photoelectric conversion layers provided on one principal surface side serving as a light incidence plane of a semiconductor substrate,
a penetrating electrode that is provided in a pixel area, connected at one end to the photoelectric conversion layer to penetrate through front and back surfaces of the semiconductor substrate, and configured to transfer an electric charge photoelectrically converted by the photoelectric conversion layer, to a different principal surface side of the semiconductor substrate, and
a connection pad that is provided on a same layer as a gate of a transistor provided on the different principal surface side of the semiconductor substrate, and to which a different end of the penetrating electrode is connected.

(9)
A manufacturing method of a solid-state imaging element, the manufacturing method including:
a process of forming one or more photoelectric conversion layers on one principal surface side serving as a light incidence plane of a semiconductor substrate;
a process of forming, in a pixel area, a penetrating electrode that is connected at one end to the photoelectric conversion layer to penetrate through front and back surfaces of the semiconductor substrate, and configured to transfer an electric charge photoelectrically converted by the photoelectric conversion layer, to a different principal surface side of the semiconductor substrate; and
a process of forming a gate of a transistor provided on the different principal surface side of the semiconductor substrate, and a connection pad to which a different end of the penetrating electrode is connected, on a same layer in a same process.

REFERENCE SIGNS LIST 1, 1a, 1b, 1c, 1d Solid-State Imaging Element
2 Photoelectric Conversion Layer
21 Lower Transparent Electrode
22 Photoelectric Conversion Film
23 Upper Transparent Electrode
PD1 First Photoelectric Conversion Element
PD2 Second Photoelectric Conversion Element
AMP Amplification Transistor
RST Reset Transistor
TG1, TG2 Transfer Transistor
Ga, Gr, G1, G2 Gate
FD, FD1, FD2 Floating Diffusion
10 Semiconductor Substrate
11a Source
11b, 11c Drain
31 Passivation Film
32 Planarization Film
33 On-Chip Lens
41, 42 Insulating Film
43 Gate Insulating Film 44 CESL Film
45 Interlayer Insulating Film
46 STI
50 Penetrating Electrode
52, 52a, 52b Connection Pad
53 Wiring Layer
51, 54 Contact Via

What is claimed is:

1. A solid-state imaging element, comprising:
   one or more photoelectric conversion layers provided on one principal surface side serving as a light incidence plane of a semiconductor substrate;
   a penetrating electrode that is provided in a pixel area, connected at one end to the photoelectric conversion layer to penetrate through front and back surfaces of the semiconductor substrate, and configured to transfer an electric charge photoelectrically converted by the photoelectric conversion layer, to a different principal surface side of the semiconductor substrate; and
   a connection pad that is adjacent to and provided at a same level on the different principal surface side of the semiconductor substrate as a gate of an amplification transistor and to which a different end of the penetrating electrode is connected.

2. The solid-state imaging element according to claim 1, comprising:
   a Shallow Trench Isolation (STI) that is provided at a position facing the connection pad via a gate insulating film provided on the different principal surface of the semiconductor substrate, and surrounds a side circumferential surface of the different end side of the penetrating electrode.

3. The solid-state imaging element according to claim 1, wherein the connection pad is further connected with a floating diffusion to which the electric charge is transferred.

4. The solid-state imaging element according to claim 1, wherein the connection pad extends up to a position facing a channel formation region of the amplification transistor configured to amplify the electric charge, via a gate insulating film provided on the different principal surface of the semiconductor substrate, and functions as a gate of the amplification transistor.

5. The solid-state imaging element according to claim 1, wherein the connection pad extends up to a position contacting a floating diffusion to which the electric charge is transferred, and is bonded with the floating diffusion.

6. The solid-state imaging element according to claim 1, wherein a material of the connection pad is a same material as a gate of the amplification transistor.

7. The solid-state imaging element according to claim 1, wherein a material of the connection pad is a semiconductor doped with an impurity.

8. The solid-state imaging element according to claim 1, further comprising two or more photoelectric conversion layers provided on the one principal surface side serving as the light incidence plane of the semiconductor substrate.

9. An electronic device, comprising:
   a solid-state imaging element, wherein the solid-state imaging element includes:
   one or more photoelectric conversion layers provided on one principal surface side serving as a light incidence plane of a semiconductor substrate;
   a penetrating electrode that is provided in a pixel area, connected at one end to the photoelectric conversion layer to penetrate through front and back surfaces of the semiconductor substrate, and configured to transfer an electric charge photoelectrically converted by the photoelectric conversion layer, to a different principal surface side of the semiconductor substrate; and
   a connection pad that is adjacent to and provided at a same level on the different principal surface side of the semiconductor substrate as a gate of an amplification transistor and to which a different end of the penetrating electrode is connected.

10. The electronic device according to claim 9, further comprising two or more photoelectric conversion layers provided on the one principal surface side serving as the light incidence plane of the semiconductor substrate.

11. The electronic device according to claim 9, comprising:
    a Shallow Trench Isolation (STI) that is provided at a position facing the connection pad via a gate insulating film provided on the different principal surface of the semiconductor substrate, and surrounds a side circumferential surface of the different end side of the penetrating electrode.

12. The electronic device according to claim 9, wherein the connection pad is connected with a floating diffusion to which the electric charge is transferred.

13. The electronic device according to claim 9, wherein the connection pad extends up to a position facing a channel formation region of the amplification transistor configured to amplify the electric charge, via a gate insulating film provided on the different principal surface of the semiconductor substrate, and functions as a gate of the amplification transistor.

14. The electronic device according to claim 9, wherein the connection pad extends up to a position contacting a floating diffusion to which the electric charge is transferred, and is bonded with the floating diffusion.

15. The electronic device according to claim 9, wherein a material of the connection pad is a same material as a gate of the transistor.

16. The electronic device according to claim 9, wherein a material of the connection pad is a semiconductor doped with an impurity.

17. A manufacturing method of a solid-state imaging element, the manufacturing method comprising:
    a process of forming one or more photoelectric conversion layers on one principal surface side serving as a light incidence plane of a semiconductor substrate;
    a process of forming, in a pixel area, a penetrating electrode that is connected at one end to the photoelectric conversion layer to penetrate through front and back surfaces of the semiconductor substrate, and configured to transfer an electric charge photoelectrically converted by the photoelectric conversion layer, to a different principal surface side of the semiconductor substrate; and
    a process of forming a connection pad adjacent to and at a same level on the different principal surface side of the semiconductor substrate as a gate of an amplification transistor to which a different end of the penetrating electrode is connected.

18. The manufacturing method of a solid-state imaging element according to claim 17, wherein the manufacturing method further comprises a process of forming two or more photoelectric conversion layers on the one principal surface side serving as the light incidence plane of the semiconductor substrate.

19. The manufacturing method of a solid-state imaging element according to claim 17, wherein the manufacturing method further comprises a process of forming a Shallow Trench Isolation (STI) that is provided at a position facing the connection pad via a gate insulating film provided on the different principal surface of the semiconductor substrate, and surrounds a side circumferential surface of the different end side of the penetrating electrode.

20. The manufacturing method of a solid-state imaging element according to claim 17, wherein the manufacturing method further comprises a process connecting the connection pad with a floating diffusion to which the electric charge is transferred.

* * * * *